United States Patent
Kuo et al.

(10) Patent No.: US 12,009,379 B2
(45) Date of Patent: Jun. 11, 2024

(54) IMAGE SENSOR

(71) Applicant: VisEra Technologies Company Limited, Hsin-Chu (TW)

(72) Inventors: Wu-Cheng Kuo, Hsin-Chu (TW); Kuo-Feng Lin, Kaohsiung (TW); Tsung-Lin Wu, Taichung (TW); Chin-Chuan Hsieh, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 633 days.

(21) Appl. No.: 15/583,569

(22) Filed: May 1, 2017

(65) Prior Publication Data
US 2018/0315788 A1   Nov. 1, 2018

(51) Int. Cl.
*H01L 27/146*  (2006.01)
*G02B 5/20*  (2006.01)
(Continued)

(52) U.S. Cl.
CPC ........ *H01L 27/14623* (2013.01); *G02B 5/207* (2013.01); *G02B 5/208* (2013.01); *G02B 5/26* (2013.01); *G02B 5/281* (2013.01); *G02B 5/288* (2013.01); *H01L 27/14605* (2013.01); *H01L 27/14607* (2013.01); *H01L 27/14621* (2013.01); *H01L 27/14627* (2013.01);
(Continued)

(58) Field of Classification Search
CPC ........ H01L 27/14669; H01L 27/14667; H01L 27/14647; H01L 27/14652; H01L 27/307; H01L 27/14645; H01L 27/14649; H01L 27/1461; H01L 27/14643; H01L 27/14621; H10K 19/201; H10K 39/32; H10K 39/401
See application file for complete search history.

(56) References Cited

U.S. PATENT DOCUMENTS

| 5,550,373 A * | 8/1996 | Cole .................. G01J 3/02 250/338.1 |
| H001911 H * | 11/2000 | Land ...................... 264/1.36 |

(Continued)

FOREIGN PATENT DOCUMENTS

| CN | 102376724 A | 3/2012 |
| CN | 104425719 A | 3/2015 |

(Continued)

OTHER PUBLICATIONS

Fabry-perot interferometers overview, retrieved from https://www.sciencedirect.com/topics/physics-and-astronomy/fabry-perot-interferometers (Year: 2019).*

(Continued)

*Primary Examiner* — Sophia T Nguyen
(74) *Attorney, Agent, or Firm* — MUNCY, GEISSLER, OLDS & LOWE, PLLC

(57) ABSTRACT

An image sensor is provided. The image sensor includes a substrate having a first region and a second region adjacent to each other; and a first photoelectric conversion component disposed on the first region of the substrate, and the first photoelectric conversion component includes: a first metal layer formed on the substrate; a first photoelectric conversion layer formed on the first metal layer; and a second metal layer formed on the first photoelectric conversion layer.

11 Claims, 14 Drawing Sheets

(51) Int. Cl.
  *G02B 5/26* (2006.01)
  *G02B 5/28* (2006.01)
  *H01L 31/0216* (2014.01)
  *H01L 31/0232* (2014.01)
  *H01L 31/101* (2006.01)

(52) U.S. Cl.
  CPC .... *H01L 27/1463* (2013.01); *H01L 27/14645* (2013.01); *H01L 27/14647* (2013.01); *H01L 27/14649* (2013.01); *H01L 27/14652* (2013.01); *H01L 27/14667* (2013.01); *H01L 27/14669* (2013.01); *H01L 31/02165* (2013.01); *H01L 31/02327* (2013.01); *H01L 31/1013* (2013.01); *G02B 5/265* (2013.01); *H01L 2924/12043* (2013.01)

(56) References Cited

U.S. PATENT DOCUMENTS

| | | | | |
|---|---|---|---|---|
| 6,228,758 | B1* | 5/2001 | Pellerin | H01L 21/76808 257/E21.579 |
| 6,300,612 | B1* | 10/2001 | Yu | B82Y 10/00 250/214.1 |
| 6,627,923 | B1* | 9/2003 | Lipson | H01L 33/105 257/102 |
| 6,689,643 | B2* | 2/2004 | Cheng | H01G 4/005 257/E21.011 |
| 6,690,699 | B2* | 2/2004 | Capasso | B82T 20/00 372/44.01 |
| 6,818,557 | B1* | 11/2004 | Ngo | C23C 16/0245 438/687 |
| 6,962,872 | B2* | 11/2005 | Chudzik | H01L 23/50 257/E23.079 |
| 6,969,874 | B1* | 11/2005 | Gee | H01L 33/105 257/94 |
| 7,129,466 | B2* | 10/2006 | Iwasaki | H10K 30/152 250/214.1 |
| 7,394,841 | B1* | 7/2008 | Konttinen | G02F 1/3501 372/21 |
| 7,411,620 | B2* | 8/2008 | Taniguchi | H01L 27/14647 257/E27.15 |
| 7,521,666 | B2* | 4/2009 | Tsang | G02B 5/282 250/226 |
| 7,667,755 | B2* | 2/2010 | Misawa | H04N 23/88 348/297 |
| 8,232,471 | B2* | 7/2012 | Nomura | H10K 85/652 429/111 |
| 8,710,418 | B2* | 4/2014 | Natori | H04N 9/07 257/443 |
| 9,029,681 | B1* | 5/2015 | Nielson | F24S 30/455 136/246 |
| 9,257,477 | B2* | 2/2016 | Godaiin | H01L 27/14636 |
| 9,313,432 | B2* | 4/2016 | Pyeoun | H04N 25/134 |
| 9,337,108 | B2* | 5/2016 | Ji | H01L 21/28202 |
| 9,385,166 | B2* | 7/2016 | Jung | H01L 27/14609 |
| 9,691,823 | B2* | 6/2017 | Park | H10K 39/32 |
| 9,871,079 | B2* | 1/2018 | Lee | H10K 39/32 |
| 10,008,544 | B2* | 6/2018 | Park | H01L 51/44 |
| 10,212,367 | B2* | 2/2019 | Lee | H01L 27/14605 |
| 10,284,758 | B2* | 5/2019 | Toda | H01L 27/14612 |
| 10,840,292 | B2* | 11/2020 | Jin | H01L 27/14645 |
| 10,847,581 | B2* | 11/2020 | Yamaguchi | H01L 31/10 |
| 10,854,661 | B2* | 12/2020 | Hatakeyama | H01L 27/14806 |
| 10,854,832 | B2* | 12/2020 | Park | H10K 30/30 |
| 10,861,887 | B2* | 12/2020 | Lee | H01L 27/1463 |
| 11,005,070 | B2* | 5/2021 | Heo | H10K 50/844 |
| 2002/0067419 | A1* | 6/2002 | Inoue | G02F 1/133509 348/333.03 |
| 2003/0013008 | A1* | 1/2003 | Ono | H01G 9/2018 429/111 |
| 2003/0047752 | A1* | 3/2003 | Campbell | H01L 31/107 257/186 |
| 2003/0198435 | A1* | 10/2003 | Khalfallah | G02B 5/20 385/37 |
| 2004/0135209 | A1* | 7/2004 | Hsieh | H01L 27/14636 257/E27.132 |
| 2004/0169245 | A1* | 9/2004 | Unlu | H01L 31/0392 257/432 |
| 2005/0205903 | A1* | 9/2005 | Hioki | H10K 85/652 257/E27.135 |
| 2005/0230775 | A1* | 10/2005 | Watanabe | H01L 27/14647 257/444 |
| 2006/0040457 | A1* | 2/2006 | Lee | H01L 21/02112 438/381 |
| 2006/0110840 | A1* | 5/2006 | Araki | H01L 27/307 438/22 |
| 2006/0115952 | A1* | 6/2006 | Wu | H01L 27/10855 438/386 |
| 2006/0118721 | A1* | 6/2006 | Antoszewski | G01J 3/02 250/338.4 |
| 2006/0181629 | A1* | 8/2006 | Miyashita | H01L 27/14623 348/311 |
| 2006/0205208 | A1* | 9/2006 | Sakata | H01L 21/76808 438/639 |
| 2006/0254639 | A1* | 11/2006 | Idota | H10K 30/211 136/263 |
| 2007/0045760 | A1* | 3/2007 | Ihama | H01L 27/14667 257/431 |
| 2007/0052051 | A1* | 3/2007 | Osaka | H01L 27/14647 257/E31.121 |
| 2007/0120045 | A1* | 5/2007 | Yokoyama | H01L 27/307 250/214 R |
| 2007/0131991 | A1* | 6/2007 | Sugawa | H01L 27/14603 257/292 |
| 2007/0201738 | A1* | 8/2007 | Toda | H04N 9/045 382/144 |
| 2007/0272836 | A1* | 11/2007 | Higashitsutsumi | G01J 3/36 250/226 |
| 2007/0279501 | A1* | 12/2007 | Goto | H01L 27/14627 348/E9.01 |
| 2008/0067330 | A1* | 3/2008 | Yamamoto | H01L 27/14621 264/1.36 |
| 2008/0087800 | A1* | 4/2008 | Toda | H01L 27/14645 257/E31.037 |
| 2008/0225142 | A1* | 9/2008 | Goto | H04N 25/00 257/E27.142 |
| 2008/0230123 | A1* | 9/2008 | Mitsui | H10K 30/10 257/E51.026 |
| 2008/0240747 | A1* | 10/2008 | Ikami | G01N 21/6456 399/32 |
| 2008/0246107 | A1* | 10/2008 | Maehara | H01L 27/1462 257/432 |
| 2009/0046185 | A1* | 2/2009 | Ota | H04N 5/23232 348/294 |
| 2009/0050881 | A1* | 2/2009 | Hayashi | B82Y 10/00 257/E51.001 |
| 2009/0140123 | A1* | 6/2009 | Shen | H01L 27/307 250/206 |
| 2009/0147101 | A1* | 6/2009 | Tatani | H01L 27/14621 348/224.1 |
| 2009/0159785 | A1* | 6/2009 | Tsang | G02B 5/288 250/226 |
| 2009/0165850 | A1* | 7/2009 | Saita | H01L 31/022466 257/E29.139 |
| 2009/0315136 | A1* | 12/2009 | Hayashi | H01L 27/14647 257/440 |
| 2010/0123070 | A1* | 5/2010 | Natori | H01L 27/14647 250/226 |
| 2010/0187501 | A1* | 7/2010 | Toda | H01L 27/14632 438/63 |
| 2010/0200898 | A1* | 8/2010 | Lin | H01L 27/14618 257/294 |
| 2010/0276736 | A1* | 11/2010 | Bocko | H01L 27/14634 438/73 |
| 2010/0289885 | A1* | 11/2010 | Lu | H04N 5/2258 348/61 |
| 2011/0001128 | A1* | 1/2011 | Kim | H01L 27/307 438/57 |
| 2011/0019042 | A1* | 1/2011 | Yamaguchi | H01L 27/14689 257/E31.127 |

(56) References Cited

U.S. PATENT DOCUMENTS

| | | | | |
|---|---|---|---|---|
| 2011/0068251 A1* | 3/2011 | Narui | H01L 27/14647 | 250/208.1 |
| 2011/0115919 A1* | 5/2011 | Hiramoto | H01L 27/14621 | 348/164 |
| 2011/0116078 A1* | 5/2011 | Cho | H01L 27/14625 | 356/51 |
| 2011/0128423 A1* | 6/2011 | Lee | H01L 27/14625 | 348/294 |
| 2011/0194019 A1* | 8/2011 | Shyu | G02B 13/0025 | 348/360 |
| 2011/0205412 A1* | 8/2011 | Miyazaki | H01L 27/14632 | 348/294 |
| 2011/0214736 A1* | 9/2011 | Lee | H01L 31/109 | 136/258 |
| 2011/0216212 A1* | 9/2011 | Watanabe | H04N 23/73 | 257/292 |
| 2011/0220778 A1* | 9/2011 | Inaba | H01L 27/14647 | 250/208.1 |
| 2011/0317048 A1* | 12/2011 | Bai | H04N 5/33 | 257/443 |
| 2012/0033116 A1 | 2/2012 | Kato | | |
| 2012/0056073 A1* | 3/2012 | Ahn | H01L 27/14645 | 257/E31.127 |
| 2012/0056192 A1* | 3/2012 | Nam | H01L 27/14647 | 257/E31.027 |
| 2012/0193689 A1* | 8/2012 | Park | H01L 27/14647 | 257/E31.083 |
| 2012/0241618 A1* | 9/2012 | Hsu | H01L 27/14649 | 250/208.1 |
| 2012/0256090 A1* | 10/2012 | Sa | G01J 3/513 | 250/349 |
| 2012/0257090 A1* | 10/2012 | Sa | G01J 3/513 | 250/349 |
| 2013/0062522 A1* | 3/2013 | Jiang | H01L 27/14609 | 250/338.4 |
| 2013/0082343 A1* | 4/2013 | Fudaba | H01L 27/14647 | 257/E31.13 |
| 2013/0154041 A1* | 6/2013 | Kokubun | H01L 27/146 | 257/E31.127 |
| 2013/0163005 A1* | 6/2013 | Tsang | G01J 3/513 | 356/519 |
| 2013/0234029 A1* | 9/2013 | Bikumandla | H01L 25/043 | 257/432 |
| 2014/0008653 A1* | 1/2014 | Chang | G01J 3/36 | 257/53 |
| 2014/0008660 A1* | 1/2014 | Jorgenson | H01L 21/0237 | 257/76 |
| 2014/0070189 A1* | 3/2014 | Leem | H10K 50/816 | 257/40 |
| 2014/0078356 A1* | 3/2014 | Vaartstra | H01L 27/14629 | 348/273 |
| 2014/0117321 A1* | 5/2014 | Lim | H10K 85/621 | 257/40 |
| 2014/0264687 A1* | 9/2014 | Hsieh | H01L 27/14627 | 257/432 |
| 2014/0264696 A1* | 9/2014 | Chien | H01L 27/14623 | 257/432 |
| 2015/0014788 A1* | 1/2015 | Park | H01L 29/66545 | 257/401 |
| 2015/0048474 A1* | 2/2015 | Ishiwata | H01L 27/14603 | 257/443 |
| 2015/0060644 A1* | 3/2015 | Fukuhara | H04N 25/70 | 250/208.1 |
| 2015/0087149 A1* | 3/2015 | He | H01L 21/0338 | 438/696 |
| 2015/0091115 A1* | 4/2015 | Lin | H01L 27/1463 | 257/432 |
| 2015/0171146 A1* | 6/2015 | Ooki | H01L 27/14627 | 257/40 |
| 2015/0187844 A1* | 7/2015 | Lee | H04N 25/134 | 257/443 |
| 2015/0221691 A1* | 8/2015 | Watanabe | H04N 23/11 | 257/432 |
| 2015/0287766 A1* | 10/2015 | Kim | H01L 27/14649 | 257/40 |
| 2015/0311258 A1* | 10/2015 | Kim | H01L 27/307 | 257/40 |
| 2015/0318320 A1* | 11/2015 | Lin | H01L 27/14603 | 257/432 |
| 2015/0334320 A1* | 11/2015 | Sasaki | H04N 5/351 | 348/297 |
| 2015/0372036 A1* | 12/2015 | Suh | H01L 27/14625 | 257/432 |
| 2015/0373243 A1* | 12/2015 | Toda | H01L 27/156 | 348/294 |
| 2016/0035793 A1* | 2/2016 | Park | H01L 27/286 | 257/40 |
| 2016/0065870 A1* | 3/2016 | Pyeoun | H01L 27/14623 | 348/302 |
| 2016/0099270 A1* | 4/2016 | Hsu | H01L 27/14621 | 257/432 |
| 2016/0099272 A1* | 4/2016 | Wang | G02B 5/22 | 359/359 |
| 2016/0099280 A1* | 4/2016 | Huang | H01L 27/14621 | 250/208.1 |
| 2016/0104735 A1* | 4/2016 | Li | H01L 27/1462 | 359/359 |
| 2016/0111457 A1* | 4/2016 | Sekine | H01L 27/14643 | 257/228 |
| 2016/0119563 A1* | 4/2016 | Yamada | H01L 27/14667 | 348/230.1 |
| 2016/0149132 A1* | 5/2016 | Lim | C09B 57/00 | 546/268.1 |
| 2016/0163760 A1* | 6/2016 | Tsai | H01L 27/14685 | 438/70 |
| 2016/0172410 A1* | 6/2016 | Kurokawa | H01L 27/14643 | 257/42 |
| 2016/0211294 A1* | 7/2016 | Lin | H01L 27/14621 | |
| 2016/0227194 A1 | 8/2016 | Kim et al. | | |
| 2016/0231600 A1* | 8/2016 | Harada | H01L 27/14625 | |
| 2016/0247860 A1* | 8/2016 | Ito | H01L 51/4253 | |
| 2016/0249025 A1* | 8/2016 | Aruga | H01L 27/14645 | |
| 2016/0254304 A1* | 9/2016 | Chou | H04N 5/33 | 257/432 |
| 2016/0293873 A1* | 10/2016 | Yamaguchi | H01L 27/14636 | |
| 2016/0300879 A1* | 10/2016 | Harada | H01L 27/14621 | |
| 2016/0301897 A1* | 10/2016 | Huang | H01L 27/14627 | |
| 2016/0315112 A1* | 10/2016 | Park | H01L 27/14623 | |
| 2016/0315115 A1* | 10/2016 | Izuha | H04N 25/134 | |
| 2016/0336365 A1* | 11/2016 | Huang | H01L 27/14645 | |
| 2016/0380032 A1* | 12/2016 | Park | H01L 27/14649 | 257/40 |
| 2017/0005142 A1* | 1/2017 | Lee | H10K 30/30 | |
| 2017/0034456 A1 | 2/2017 | Kyung et al. | | |
| 2017/0040362 A1* | 2/2017 | Na | H01L 27/14605 | |
| 2017/0053958 A1* | 2/2017 | Lee | H01L 31/1013 | |
| 2017/0059754 A1* | 3/2017 | Frey | G02B 5/201 | |
| 2017/0062496 A1* | 3/2017 | Lai | H01L 27/1463 | |
| 2017/0084761 A1* | 3/2017 | Cho | H01L 27/14647 | |
| 2017/0115436 A1* | 4/2017 | Qian | G02B 5/208 | |
| 2017/0148841 A1* | 5/2017 | Matsumoto | H01L 27/14636 | |
| 2017/0150019 A1* | 5/2017 | Kyung | H04N 5/2253 | |
| 2017/0214864 A1* | 7/2017 | Izuha | H04N 25/44 | |
| 2017/0237911 A1* | 8/2017 | Won | H04N 25/70 | 248/164 |
| 2017/0243913 A1* | 8/2017 | Lee | H01L 27/14689 | |
| 2017/0278896 A1* | 9/2017 | Park | H10K 39/32 | |
| 2017/0289467 A1* | 10/2017 | Yamamoto | H04N 9/04553 | |
| 2017/0301720 A1* | 10/2017 | Tsai | H01L 27/14607 | |
| 2017/0366787 A1* | 12/2017 | Nam | H01L 27/14625 | |
| 2018/0013961 A1* | 1/2018 | Lee | H04N 25/62 | |
| 2018/0020169 A1* | 1/2018 | Mogi | H01L 27/14609 | |
| 2018/0062112 A1* | 3/2018 | Heo | H10K 39/32 | |
| 2018/0069046 A1* | 3/2018 | Jin | H04N 23/11 | |
| 2018/0070028 A1* | 3/2018 | Hsieh | H04N 23/11 | |
| 2018/0076242 A1* | 3/2018 | Hsieh | H01L 27/14627 | |
| 2018/0076253 A1* | 3/2018 | Hsieh | H01L 27/14632 | |
| 2018/0076258 A1* | 3/2018 | Hsieh | H01L 27/1462 | |

(56) References Cited

U.S. PATENT DOCUMENTS

| | | | |
|---|---|---|---|
| 2018/0190697 A1* | 7/2018 | Lee | H01L 27/14609 |
| 2018/0196138 A1* | 7/2018 | Lee | G01S 7/4817 |
| 2018/0210093 A1* | 7/2018 | Kobayashi | H10K 30/80 |
| 2018/0227525 A1* | 8/2018 | Shishido | H01L 27/14665 |
| 2018/0227526 A1* | 8/2018 | Tokuhara | H04N 25/585 |
| 2018/0247963 A1* | 8/2018 | Hsieh | H01L 27/14645 |
| 2018/0254296 A1* | 9/2018 | Hsieh | H04N 23/10 |
| 2018/0267220 A1* | 9/2018 | Frey | H01L 27/14621 |
| 2018/0315788 A1* | 11/2018 | Kuo | G02B 5/288 |
| 2018/0315791 A1* | 11/2018 | Hsieh | H01L 27/1462 |
| 2018/0321428 A1* | 11/2018 | Jones | G01J 3/02 |
| 2018/0331159 A1* | 11/2018 | Lee | H01L 27/307 |
| 2018/0359434 A1* | 12/2018 | Tanaka | H01L 27/14623 |
| 2019/0006406 A1* | 1/2019 | Ozawa | H01L 27/1462 |
| 2019/0027529 A1* | 1/2019 | Kim | H01L 31/035236 |
| 2019/0120689 A1* | 4/2019 | Leem | G06V 10/143 |
| 2019/0140031 A1* | 5/2019 | Lamkin | H10K 71/621 |
| 2019/0165021 A1* | 5/2019 | Ono | H04N 23/12 |
| 2019/0165192 A1* | 5/2019 | Hosokawa | H01L 51/444 |
| 2019/0173032 A1* | 6/2019 | Park | H01L 51/0071 |
| 2019/0189815 A1* | 6/2019 | Cho | H01L 31/0336 |
| 2019/0214591 A1* | 7/2019 | Park | H10K 30/10 |
| 2019/0221693 A1* | 7/2019 | Okumura | H01L 27/14649 |
| 2019/0305016 A1* | 10/2019 | Tsang | H01L 31/02165 |
| 2019/0312071 A1* | 10/2019 | Yamasaki | H04N 25/771 |
| 2019/0319062 A1* | 10/2019 | Lee | H01L 27/14652 |
| 2019/0386167 A1* | 12/2019 | Shimatani | H01L 31/0288 |
| 2019/0393262 A1* | 12/2019 | Hsieh | H01L 27/14627 |
| 2020/0013812 A1* | 1/2020 | Crocherie | H01L 27/14605 |
| 2020/0066810 A1* | 2/2020 | Lamkin | H10K 71/00 |
| 2020/0099003 A1* | 3/2020 | Ujiie | H01L 31/10 |
| 2020/0103511 A1* | 4/2020 | Jin | G01S 7/499 |
| 2020/0105812 A1* | 4/2020 | Sze | H01L 27/1465 |
| 2020/0152703 A1* | 5/2020 | Park | H10K 39/32 |
| 2020/0203399 A1* | 6/2020 | Yang | H01L 27/14645 |
| 2020/0296269 A1* | 9/2020 | Leem | H01L 27/14621 |
| 2021/0020699 A1* | 1/2021 | Yoshimura | H01L 51/52 |
| 2021/0066373 A1* | 3/2021 | Toda | G06V 10/143 |
| 2021/0144322 A1* | 5/2021 | Wang | H04N 25/79 |
| 2021/0193739 A1* | 6/2021 | Ogasahara | H01L 27/14647 |
| 2021/0242274 A1* | 8/2021 | Mittra | H01L 27/14649 |
| 2021/0249474 A1* | 8/2021 | Togashi | H01L 27/14612 |
| 2021/0280617 A1* | 9/2021 | Sugizaki | H01L 27/14621 |
| 2021/0335880 A1* | 10/2021 | Yamakawa | H04N 25/76 |
| 2021/0409634 A1* | 12/2021 | Sato | H04N 25/134 |
| 2022/0013585 A1* | 1/2022 | Leem | H01L 51/5004 |
| 2022/0028918 A1* | 1/2022 | Iijima | H01L 27/14636 |
| 2022/0102419 A1* | 3/2022 | Yamazaki | H01L 29/786 |
| 2022/0141400 A1* | 5/2022 | Dupoiron | H10K 39/32 348/164 |
| 2022/0165774 A1* | 5/2022 | Kim | H01L 27/14685 |
| 2022/0173167 A1* | 6/2022 | Lim | H01L 27/14621 |
| 2022/0190016 A1* | 6/2022 | Dupoiron | H04N 25/17 |
| 2022/0367541 A1* | 11/2022 | Wang | H01L 27/1465 |
| 2023/0041006 A1* | 2/2023 | Jo | H10K 85/30 |

FOREIGN PATENT DOCUMENTS

| | | |
|---|---|---|
| JP | 62-13066 | 1/1987 |
| JP | 64-10425 | 1/1989 |
| JP | 10-190147 A | 7/1998 |
| JP | 2002-502120 A | 1/2002 |
| JP | 2002-502129 A | 1/2002 |
| JP | 2007329227 A | 12/2007 |
| JP | 2011258666 A | 12/2011 |
| JP | 2012114159 A | 6/2012 |
| JP | 2014-190975 A | 10/2014 |
| JP | 2015185844 A | 10/2015 |
| JP | 2016076682 A | 5/2016 |
| JP | 2017-11273 | 1/2017 |
| WO | WO2016/194620 A1 | 12/2016 |

OTHER PUBLICATIONS

RP Photonics Encyclopedia—Fabry-Perot interferometers, optical spectrum, analysis, retrieved from https://www.rp-photonics.com/fabry_perot_interferometers.html (Year: 2019).*
High-k and Metal Gate transistor research, retrieved from https://www.intel.com/pressroom/kits/advancedtech/doodle/ref_HiK-MG/high-k.htm (Year: 2019).*
High-κ dielectric from Wikipedia (Year: 2019).*
Office Action mailed Jun. 18, 2018 in JP Application No. 2017-145445 (12 pages).
Office Action with the Search Report of corresponding CN application No. 201710859124.9; issued on Apr. 7, 2020.
Office Action issued in corresponding JP application No. 2017-145445 on May 14, 2020 with an English translation attached.
Yariv, Amnon et al., Photonics: Optical Electronics in Modern Communications, Sixth Edition, 2007—Technology & Engineering, Chapter 4, 17 pages, Oxford University Press.
Taiwanese Office Action of corresponding TW Application No. 106130281 issued on Jan. 10, 2018, 5 pages.

* cited by examiner

IMAGE SENSOR

BACKGROUND OF THE INVENTION

Field of the Invention

The disclosure relates to an image sensor, and in particular to an image sensor having a first photoelectric conversion component.

Description of the Related Art

Recently, image sensors have been widely used in various image-capturing apparatuses, for example video cameras, digital cameras and the like. Image sensors, such as charge-coupled device (CCD) image sensors or complementary metal-oxide semiconductor (CMOS) image sensors, have photoelectric converters for converting incident light into electric signals. The image sensors have a pixel array and each pixel has one photoelectric converter. The image sensors also have logic circuits for transmitting and processing the electric signals.

Moreover, image sensors usually have a color filter layer for generating color images. The color filter layer may contain a primary-color filter of red (R), blue (B) and green (G) segments stacked over the light-receiving surface of two-dimensionally arranged photoelectric converters. The color filter layer has a predetermined pattern so that each of the color segments corresponds to one photoelectric converter.

In some examples, the red (R), blue (B) and green (G) segments are connected together to form a connected color filter layer. The pixels of the image sensors corresponding to the red (R), blue (B) and green (G) segments of the connected color filter layer have different respective quantum efficiencies (QE). In some other examples, a grid structure is disposed between the red (R), blue (B) and green (G) segments to form a discontinuous color filter layer. The pixels of the image sensors corresponding to the respective red (R), blue (B) and green (G) segments of the discontinuous color filter layer also have different quantum efficiencies (QE).

However, existing image sensors have not been satisfactory in every respect. Therefore, an image sensor which has a better signal quality and may reduce the cost is needed.

BRIEF SUMMARY OF THE INVENTION

The present disclosure provides an image sensor, including: a substrate having a first region and a second region adjacent to each other; and a first photoelectric conversion component disposed on the first region of the substrate, and the first photoelectric conversion component includes: a first metal layer formed on the substrate; a first photoelectric conversion layer formed on the first metal layer; and a second metal layer formed on the first photoelectric conversion layer.

The present disclosure also provides an image sensor including a substrate having a first region and a second region, and the second region is adjacent to the first region; a first photoelectric conversion component disposed on the first region of the substrate, and the first photoelectric conversion component includes: a first bottom metal layer formed on the substrate; a first photoelectric conversion layer formed on the first bottom metal layer, and the first photoelectric conversion layer has a first thickness; and a first top metal layer formed on the first photoelectric conversion layer; and a second photoelectric conversion component disposed on the second region of the substrate, and the second photoelectric conversion component includes: a second bottom metal layer formed on the substrate; a second photoelectric conversion layer formed on the second bottom metal layer, and the second photoelectric conversion layer has a second thickness; and a second top metal layer formed on the second photoelectric conversion layer, and the first thickness is greater than the second thickness.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION OF THE INVENTION

Figure 1A:
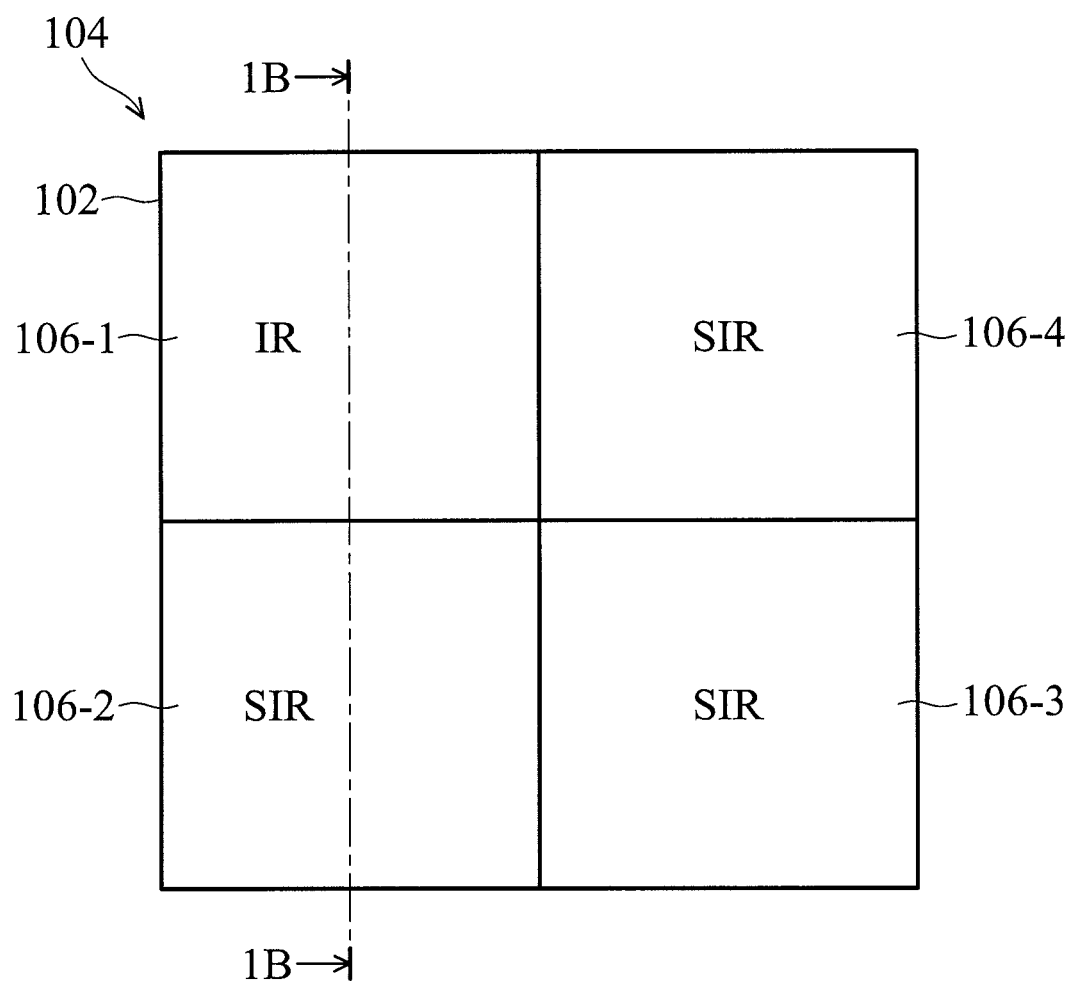
FIG. 1A is a top view of an image sensor in accordance with some embodiments of the present disclosure.

The image sensor of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed as referring to the orientation as described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In some embodiments of the present disclosure, the term "substrate" is meant to include devices formed within a semiconductor wafer and the layers overlying the wafer. All semiconductor element needed may be already formed over the substrate. However, the substrate is represented with a flat surface in order to simplify the drawing. The term "substrate surface" is meant to include the uppermost exposed layers on a semiconductor wafer, such as silicon surface, and insulating layer and/or metallurgy lines. In some embodiments of the present disclosure, the term "substrate" is meant to include devices formed within a transparent substrate and the layers overlying the transparent substrate. All transistor element needed may be already formed over the substrate. However, the substrate is represented with a flat surface in order to simplify the drawing. The term "substrate surface" is meant to include the uppermost exposed layers on a transparent substrate, such as an insulating layer and/or metallurgy lines.

The embodiment of the present disclosure utilizes a first photoelectric conversion component which may serve as a color filter and a photodiode simultaneously. Therefore, the color filter and the photodiode do not need to be formed in the image sensor separately. Therefore, the number of elements formed in the image sensor may be reduced, and the cost may be reduced accordingly. In addition, due to the usage of the first photoelectric conversion component, in some embodiments of the present disclosure, the present disclosure may reduce or prevent cross-talk between pixels. Therefore, signal quality may be improved. In some embodiments of the present disclosure, the oblique source performance of the image sensor in the present disclosure may also be improved.

This description of the exemplary embodiments is intended to be read in connection with the accompanying drawings, which are to be considered part of the entire written description. The drawings are not drawn to scale. In addition, structures and devices are shown schematically in order to simplify the drawings.

Figure 1B:
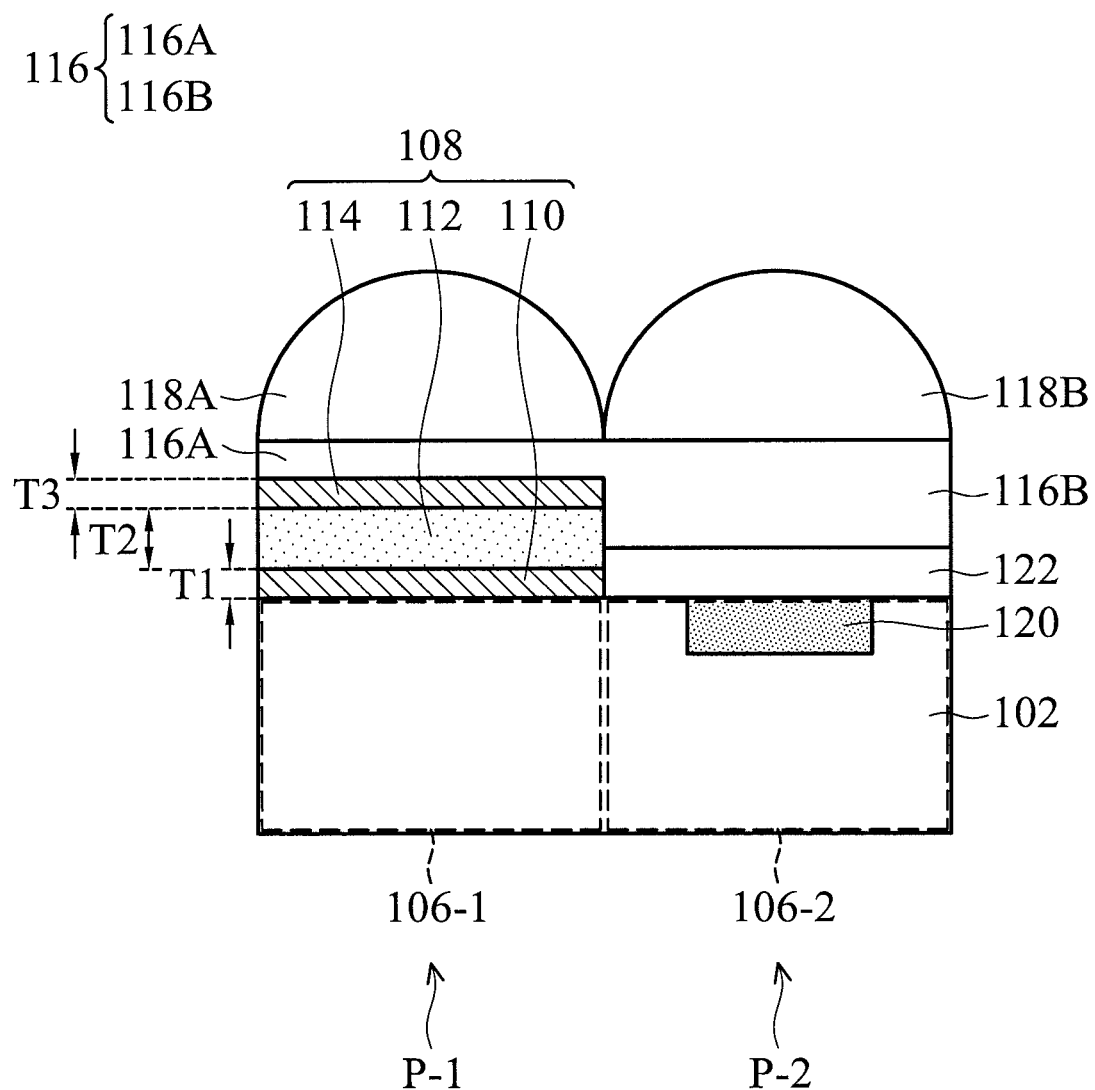
FIG. 1B is a cross-sectional view of an image sensor in accordance with some embodiments of the present disclosure.

FIG. 1A is a top view of an image sensor in accordance with some embodiments of the present disclosure, and FIG. 1B is a cross-sectional view of an image sensor along line 1B-1B in FIG. 1A in accordance with some embodiments of the present disclosure. Referring to FIGS. 1A-1B, the image sensor 100 includes a substrate 102. As illustrated in FIG. 1A, the substrate 102 includes a pixel array 104. As illustrated in FIGS. 1A-1B, the substrate 102 includes a first region 106-1, a second region 106-2, a third region 106-3, and a fourth region 106-4. In some embodiments of the present disclosure, the first region 106-1 is an IR pixel region, and the second region 106-2, the third region 106-3, and the fourth region 106-4 are selective IR cut (SIR) pixel regions. As illustrated in FIG. 1B, the first region 106-1 is adjacent to the second region 106-2.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

FIG. 1B shows the first region 106-1 (for example, IR pixel region) and the second region 106-2 (for example, SIR pixel region) of the substrate 102. In some embodiments of the present disclosure, the structures of the third region 106-3 and the fourth region 106-4 are the same as that of the second region 106-2. Therefore, in order to simplify the diagram, only the first region 106-1 and the second region 106-2 are depicted.

In some embodiments of the present disclosure, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable material, or a combination thereof.

In some embodiments, the substrate 102 includes a semiconductor-on-insulator (SOI) substrate. The SOI substrate may be fabricated using a separation by implantation of oxygen (SIMOX) process, a wafer bonding process, another applicable method, or a combination thereof. In some embodiments, the substrate 102 is an un-doped substrate.

In some embodiments of the present disclosure, referring to FIG. 1B, the image sensor 100 includes a first pixel P-1, such as an IR pixel. In addition, the image sensor 100 includes a second pixel P-2, such as a selective IR cut (SIR) pixel.

As illustrated in FIG. 1B, in some embodiments of the present disclosure, the first pixel P-1 includes the first region 106-1 of the substrate 102, and a first photoelectric conversion component 108 disposed on the first region 106-1 of the substrate 102. In some embodiments of the present disclosure, as illustrated in FIG. 1B, the first photoelectric conversion component 108 includes a first metal layer 110 disposed on the first region 106-1 of the substrate 102, a first photoelectric conversion layer 112 disposed on the first metal layer 110, and a second metal layer 114 disposed on the first photoelectric conversion layer 112.

In some embodiments of the present disclosure, the material of the first metal layer 110 includes Ag, Au, Cu, W, Al, Mo, Ti, Pt, Ir, Ni, Cr, Rh, alloys thereof, any other suitable conductive material, or a combination thereof. In some embodiments, the first metal layer 110 is deposited by using chemical vapor deposition (CVD), sputtering, resistive thermal evaporation, electron beam evaporation, or another applicable method. In some embodiments of the present disclosure, the chemical vapor deposition may include, but is not limited to, low-pressure chemical vapor deposition (LPCVD), low-temperature chemical vapor deposition (LTCVD), rapid thermal chemical vapor deposition (RT-CVD), plasma enhanced chemical vapor deposition (PECVD), atomic layer deposition (ALD), or any other suitable method.

In some embodiments of the present disclosure, the material of the first photoelectric conversion layer 112 includes a doped semiconductor layer, a quantum film, or another photoelectric conversion material. In some embodiments of the present disclosure, the material of the doped semiconductor layer includes silicon or another elementary semiconductor material such as germanium. In some other embodiments, the doped semiconductor layer includes a compound semiconductor. The compound semiconductor may include gallium arsenide, silicon carbide, indium arsenide, indium phosphide, another suitable material, or a combination thereof.

In some embodiments of the present disclosure, the doped semiconductor layer may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

In some embodiments of the present disclosure, the doped semiconductor layer is a P-type semiconductor layer. The P-type semiconductor layer may be formed by adding borane ($BH_3$) or boron tribromide ($BBr_3$) into the reaction gas to perform in-situ doping when depositing the doped semiconductor layer. Alternatively, the un-doped semiconductor layer may be deposited first, and then the un-doped semiconductor layer is ion-implanted by boron ion or indium ion.

In some other embodiments, the doped semiconductor layer is an N-type semiconductor layer. The N-type semiconductor layer may be formed by adding phosphine ($PH_3$) or arsine ($AsH_3$) into the reaction gas to perform in-situ doping when depositing the doped semiconductor layer. Alternatively, the un-doped semiconductor layer may be deposited first, and then the un-doped semiconductor layer is ion-implanted by phosphorous ion or arsenic ion.

In some embodiments of the present disclosure, the quantum film includes an organic layer blended with quantum dots or an inorganic layer blended with quantum dots. In some embodiments of the present disclosure, the material of the quantum dots includes ZnS, ZnSe, ZnTe, CdS, CdSe, CdTe, HgS, HgSe, HgTe, BN, BP, BAs, BSb, AlN, AlP, AlAs, AlSb, GaN, GaP, GaAs, GaSb, inAs, inN, inP, inSb, any other suitable quantum dot material, or a combination thereof. The organic layer includes epoxy resin, polyimide resin, any other suitable organic material, or a combination thereof.

In some embodiments of the present disclosure, the material of the second metal layer 114 includes Ag, Au, Cu, W, Al, Mo, Ti, Pt, Ir, Ni, Cr, Rh, alloys thereof, any other suitable conductive material, or a combination thereof. In some embodiments, the second metal layer 114 is deposited by using chemical vapor deposition, sputtering, resistive thermal evaporation, electron beam evaporation, or another applicable method. In some embodiments of the present disclosure, the chemical vapor deposition may include, but is not limited to, low-pressure chemical vapor deposition, low-temperature chemical vapor deposition, rapid thermal chemical vapor deposition, plasma enhanced chemical vapor deposition, atomic layer deposition, or any other suitable method.

In some embodiments of the present disclosure, as illustrated in FIG. 1B, the first pixel P-1 further includes a first transparent layer 116A disposed on the second metal layer 114. The material of the first transparent layer 116A may include, but is not limited to, an organic transparent material, a dielectric material, a semiconductor material such as silicon, any other suitable transparent material, or a combination thereof. In some embodiments of the present disclosure, the dielectric material includes silicon oxide, silicon nitride, silicon oxynitride, any other suitable dielectric material, or a combination thereof.

In some embodiments of the present disclosure, the first transparent layer 116A may be formed by chemical vapor deposition or spin-on coating. The chemical vapor deposition may include, but is not limited to, low-pressure chemical vapor deposition, low-temperature chemical vapor deposition, rapid thermal chemical vapor deposition, plasma enhanced chemical vapor deposition, atomic layer deposition, or any other suitable method. However, embodiments of the present disclosure are not limited thereto. In some other embodiments, the first pixel P-1 does not include a first transparent layer.

In some embodiments of the present disclosure, as illustrated in FIG. 1B, the first pixel P-1 further includes a first microlens 118A disposed on the first transparent layer 116A and/or the first photoelectric conversion component 108. However, embodiments of the present disclosure are not limited thereto. In some other embodiments, the first pixel P-1 does not include a first microlens.

Referring to FIG. 1B, the first photoelectric conversion layer 112 of the first photoelectric conversion component 108 may function as the photodiode of the first pixel P-1. Therefore, the first photoelectric conversion layer 112 may detect IR light. In some other embodiments, the first photoelectric conversion layer 112 may detect red light, green light, or blue light. In addition, since the first photoelectric conversion component 108 includes two metal layers 110, 114 and one first photoelectric conversion layer 112 disposed between the two metal layers 110, 114, the first photoelectric conversion component 108 may function as a Fabry-Perot cavity. Therefore, the first photoelectric conversion component 108 may selectively detect light with a specific wavelength. Therefore, the first photoelectric conversion component 108 may serve as a color filter. In addition, the wavelength of the light to be detected may be changed by fine-tuning the thickness of the first photoelectric conversion layer 112 of the first photoelectric conversion component 108.

Therefore, the embodiments of the present disclosure utilize a first photoelectric conversion component 108 which may serve as a color filter and a photodiode simultaneously. Therefore, in some embodiments of the present disclosure, the color filter and the photodiode do not need to be formed in the image sensor 100 separately. Therefore, the number of elements formed in the image sensor 100 may be reduced, and the manufacturing cost may be reduced accordingly.

In some embodiments of the present disclosure, as illustrated in FIG. 1B, the thickness T1 of the first metal layer 110 is greater than the thickness T3 of the second metal layer 114. However, embodiments of the present disclosure are not limited thereto. In some other embodiments, the thickness of the first metal layer 110 is substantially equal to the thickness T3 of the second metal layer 114.

In some embodiments of the present disclosure, the thickness T1 of the first metal layer 110 may range from about 50 nm to 200 nm, for example from about 100 nm to 150 nm. In some embodiments of the present disclosure, the thickness T2 of the first photoelectric conversion layer 112 may range from about 10 nm to 200 nm, for example from about 70 nm to 150 nm. In some embodiments of the present disclosure, the thickness T3 of the second metal layer 114 may range from about 30 nm to 100 nm, for example from about 55 nm to 70 nm.

The term "about" typically means+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about".

In some embodiments of the present disclosure, as illustrated in FIG. 1B, the second pixel P-2 includes the second region 106-2 of the substrate 102, and a second photoelectric conversion component 120 disposed in the second region 106-2 of the substrate 102. The second photoelectric conversion component 120 is embedded in the substrate 102. In some embodiments of the present disclosure, the second pixel P-2 further includes a high-k dielectric layer 122 disposed on the substrate 102 or on the second photoelectric conversion component 120, and a second transparent layer 116B disposed on the high-k dielectric layer 122.

In some embodiments of the present disclosure, the second photoelectric conversion component 120 may be formed by ion implantation. For example, when the second photoelectric conversion component 120 is N-type, the predetermined region for the second photoelectric conversion component 120 may be implanted with phosphorous ions or arsenic ions to form the second photoelectric conversion component 120. In some other embodiments, when the second photoelectric conversion component 120 is P-type, the predetermined region for the second photoelectric conversion component 120 may be implanted with boron ion, indium ion or boron difluoride ion ($BF_2^+$) to form the second photoelectric conversion component 120.

In some embodiments of the present disclosure, the material of the high-k dielectric layer 122 may include, but is not limited to, high-k material, any other suitable high-k dielectric material, or a combination thereof. The high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfSiO, HfTaTiO, HfAlON, $(Ba,Sr)TiO_3$(BST), $Al_2O_3$, any other suitable high-k dielectric material, or a combination thereof. The high-k dielectric layer 122 may be formed by chemical vapor deposition or spin-on coating. The chemical vapor deposition may include, but is not limited to, low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), or any other suitable method.

In some embodiments of the present disclosure, the material of the second transparent layer 116B may include, but is not limited to, an organic transparent material, a dielectric material, a semiconductor material such as silicon, any other suitable transparent material, or a combination thereof. In some embodiments of the present disclosure, the dielectric material includes silicon oxide, silicon nitride, silicon oxynitride, any other suitable dielectric material, or a combination thereof. In some embodiments of the present disclosure, the second transparent layer 116B may be formed by chemical vapor deposition or spin-on coating. The chemical vapor deposition may include, but is not limited to, low-pressure chemical vapor deposition, low-temperature chemical vapor deposition, rapid thermal chemical vapor deposition, plasma enhanced chemical vapor deposition, atomic layer deposition, or any other suitable method. However, embodiments of the present disclosure are not limited thereto. In some other embodiments, the second pixel P-2 does not include a second transparent layer.

In some embodiments of the present disclosure, as illustrated in FIG. 1B, the first transparent layer 116A and the second transparent layer 116B are a single transparent layer. This single transparent layer extends over the first photoelectric conversion component 108 and the high-k dielectric layer 122. However, embodiments of the present disclosure are not limited thereto. In some other embodiments, this single transparent layer does not extend over the first photoelectric conversion component 108.

In some embodiments of the present disclosure, the second pixel P-2 further includes a second microlens 118B disposed on the second transparent layer 116B. However, embodiments of the present disclosure are not limited thereto. In some other embodiments, the second pixel P-2 does not include a second microlens.

In some embodiments of the present disclosure, as illustrated in FIG. 1B, the second photoelectric conversion component 120 of the second pixel P-2 does not contact the first metal layer 110 of the first photoelectric conversion component 108 of the first pixel P-1. In other words, the second photoelectric conversion component 120 of the second pixel P-2 is spaced apart from the first metal layer 110 of the first photoelectric conversion component 108 of the first pixel P-1. Since the second photoelectric conversion component 120 does not contact the first metal layer 110 of the first photoelectric conversion component 108, some embodiments of the present disclosure may reduce or prevent cross-talk between the first pixel P-1 and the second pixel P-2. Therefore, signal quality may be improved.

Figure 2:
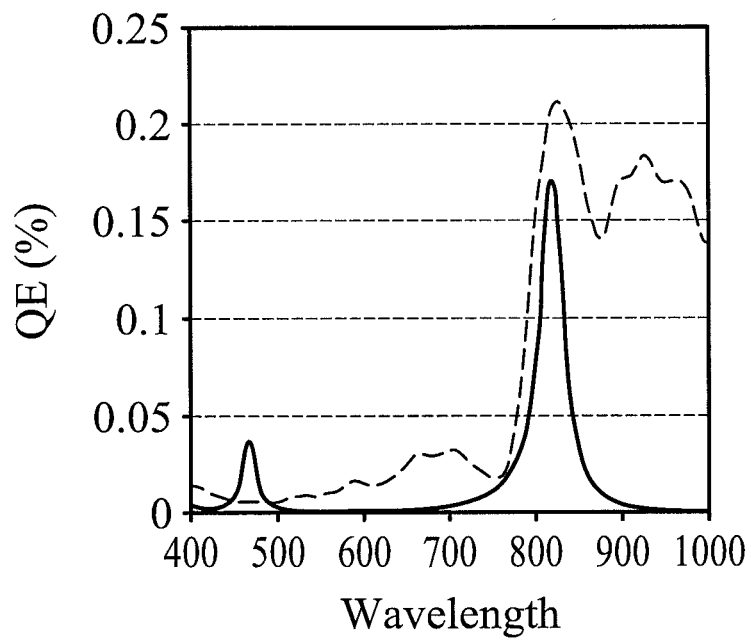
FIG. 2 is a spectrum of quantum efficiency versus wavelength according to some embodiments of the present disclosure.

FIG. 2 is a spectrum of quantum efficiency versus wavelength. Specifically, the spectrum represented by the solid line represents the spectrum derived by the image sensor of the P-1(106-1) in some embodiments of the present disclosure. In addition, the spectrum indicated by the dash line represents the spectrum derived by a traditional image sensor. As illustrated in FIG. 2, the signal derived by the image sensor in some embodiments of the present disclosure is better and is clearer than the signal derived by a traditional image sensor.

In addition, since some embodiments of the present disclosure may reduce or prevent cross-talk between the first pixel P-1 and the second pixel P-2, the image sensor 100 of some embodiments of the present disclosure does not need an isolation structure between the first pixel P-1 and the second pixel P-2. Therefore, manufacturing cost may be reduced, and the structural stability of the image sensor 100 may be improved.

Figure 3:
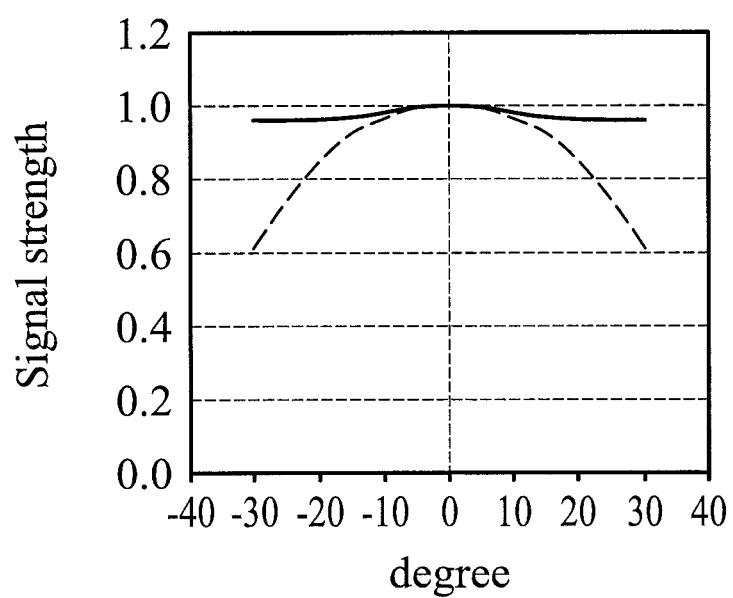
FIG. 3 is an analytical figure of signal strength versus incident angle of incident light according to some embodiments of the present disclosure.

In addition, the first photoelectric conversion component 108 may reduce the influence of signal by the incident angle of the incident light. FIG. 3 is an analytical figure of signal strength versus the incident angle of the incident light. Specifically, the signal indicated by the solid line represents the signal derived by the image sensor in some embodiments of the P-1(106-1) of the present disclosure. In addition, the signal indicated by the dash line represents the signal derived by a traditional image sensor. As illustrated in FIG. 3, the signal strength derived by the image sensor in some embodiments of the present disclosure does not change substantially as the incident angle of the incident light alters from 30 degrees to −30 degrees. In contrast, the signal derived by the traditional image sensor changes a lot as the incident angle of the incident light is altered from 30 degrees to −30 degrees. Therefore, in some embodiments of the present disclosure, the oblique source performance of the image sensor 100 in the present disclosure may be improved.

Figure 4:
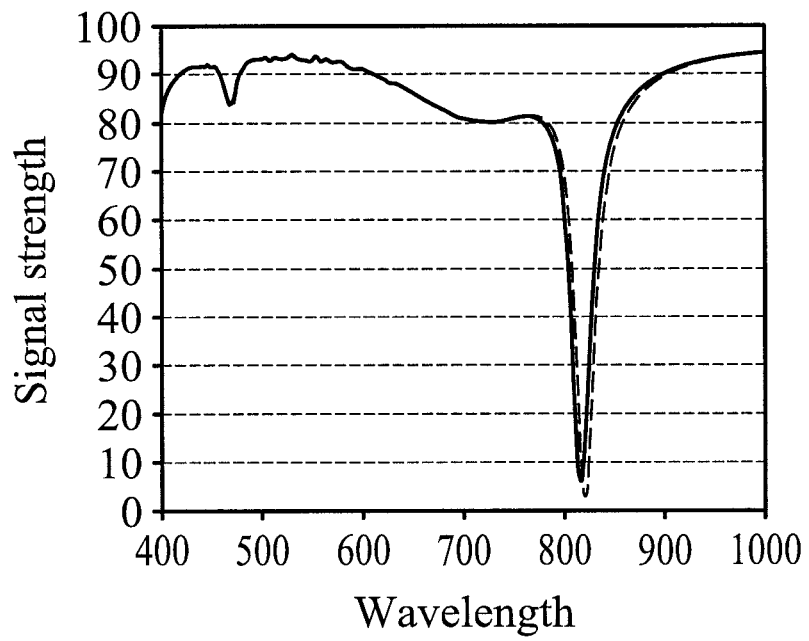
FIG. 4 is an analytical figure of signal strength versus wavelength according to some embodiments of the present disclosure.

FIG. 4 is an analytical figure of signal strength versus wavelength according to some embodiments of the P-1(106-1) of the present disclosure. Specifically, the signal indicated by the solid line represents the signal derived by the image sensor in some embodiments of the present disclosure when the incident angle of the incident light is 0 degrees. In addition, the signal indicated by the dash line represents the signal derived by the image sensor in some embodiments of the present disclosure when the incident angle of the incident light is 30 degrees. As shown in FIG. 4, the signal derived by the image sensor when the incident angle of the incident light is 0 degrees is substantially overlapped with the signal derived by the image sensor when the incident angle of the incident light is 30 degrees. Therefore, in some embodiments of the present disclosure, the oblique source performance of the image sensor 100 in the present disclosure may be improved.

Figure 5:
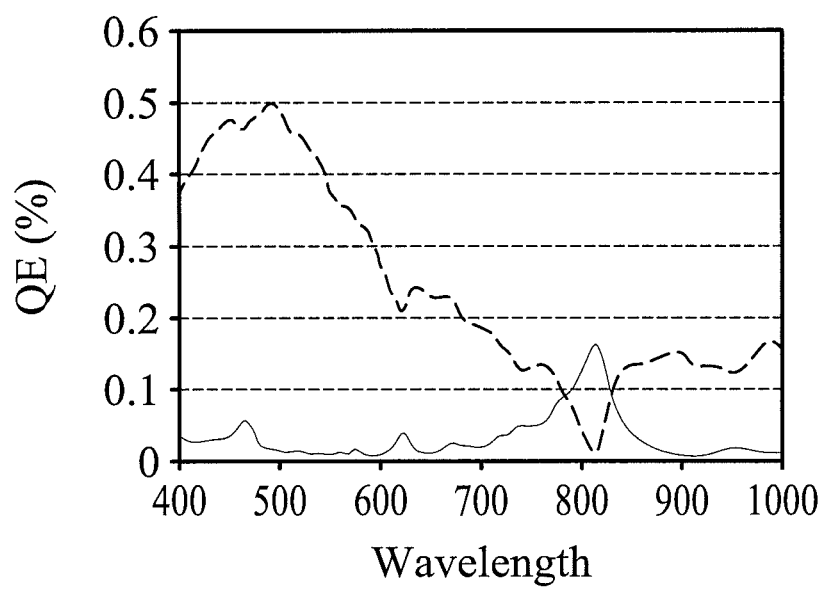
FIG. 5 is a spectrum of quantum efficiency versus wavelength in accordance with some embodiments of the present disclosure.

FIG. 5 is a spectrum of quantum efficiency (QE) versus wavelength according to some embodiments of the present disclosure. Specifically, the spectrum indicated by the solid line represents the spectrum derived by the first pixel P-1 of some embodiments of the present disclosure. In addition, the spectrum indicated by the dash line is derived by the spectrum detected by the second pixel P-2 to substrate the spectrum detected by the first pixel P-1. Therefore, the spectrum indicated by the dash line represents the selective IR cut (SIR) signal.

In some embodiments of the present disclosure, the image sensor 100 of the embodiments of the present disclosure may be applied in a light sensor device, a proximity sensor device, a Time-of-Flight (TOF) device, a spectrometer, an internet of things (IoT) device, or any other suitable device.

Figure 6:
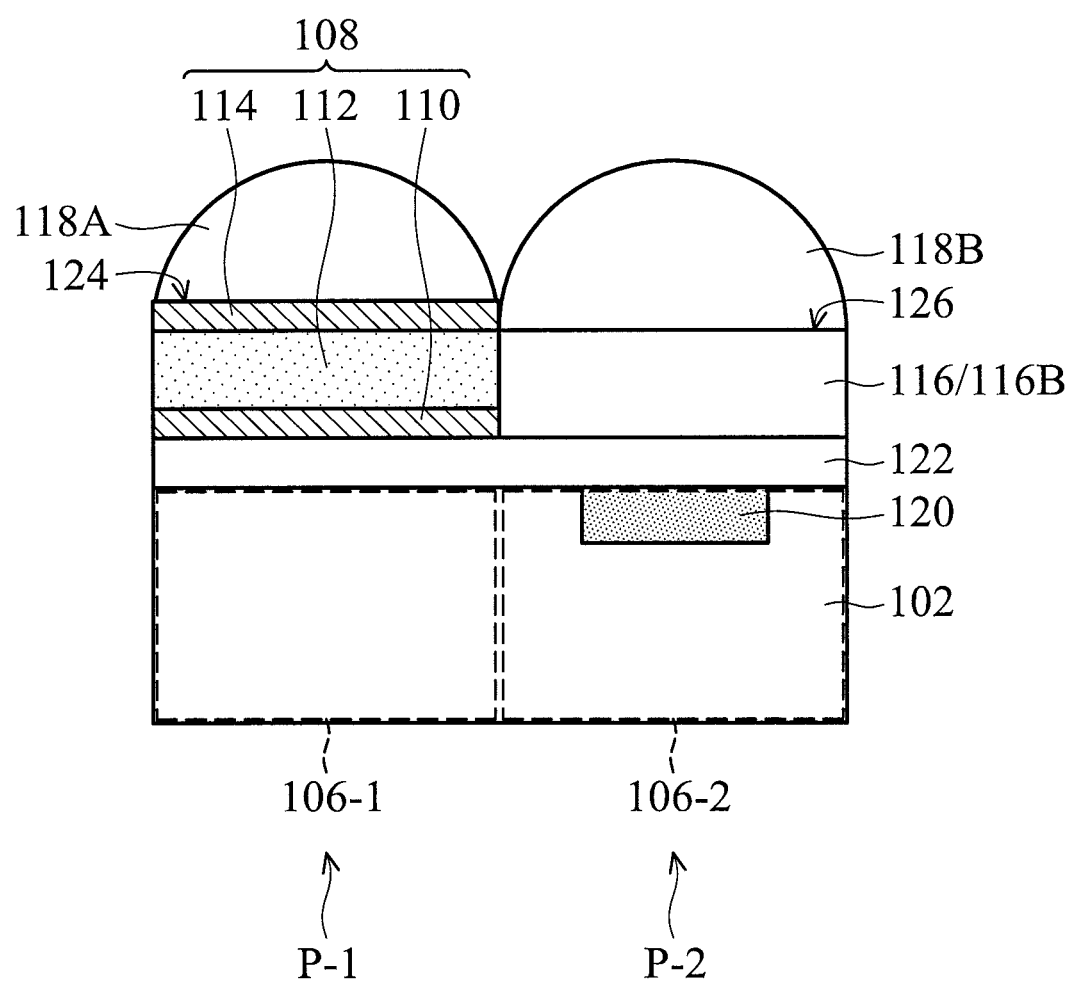
FIG. 6 is a cross-sectional view of an image sensor in accordance with some other embodiments of the present disclosure.

FIG. 6 is a cross-sectional view of an image sensor 600 in accordance with some other embodiments of the present disclosure. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

The difference between the embodiments shown in FIG. 6 and the embodiments shown in FIG. 1B is that the high-k dielectric layer 122 extends on the first region 106-1 and is disposed between the substrate 102 and the first photoelectric conversion component 108. In other words, the first pixel P-1 further includes the portion of the high-k dielectric layer 122 disposed on the first region 106-1 and between the substrate 102 and the first photoelectric conversion component 108.

In addition, in some embodiments of the present disclosure, as illustrated in FIG. 6, the transparent layer 116 does not extend over the first region 106-1. In other words, in some embodiments of the present disclosure, as illustrated in FIG. 6, the first pixel P-1 does not include a transparent layer.

In some embodiments of the present disclosure, as illustrated in FIG. 6, the top surface 124 of the first photoelectric conversion component 108 is higher than the top surface 126 of the second transparent layer 116B of the transparent layer 116. In some embodiments of the present disclosure, as illustrated in FIG. 6, the first microlens 118A is higher than the second microlens 118B.

Figure 7:
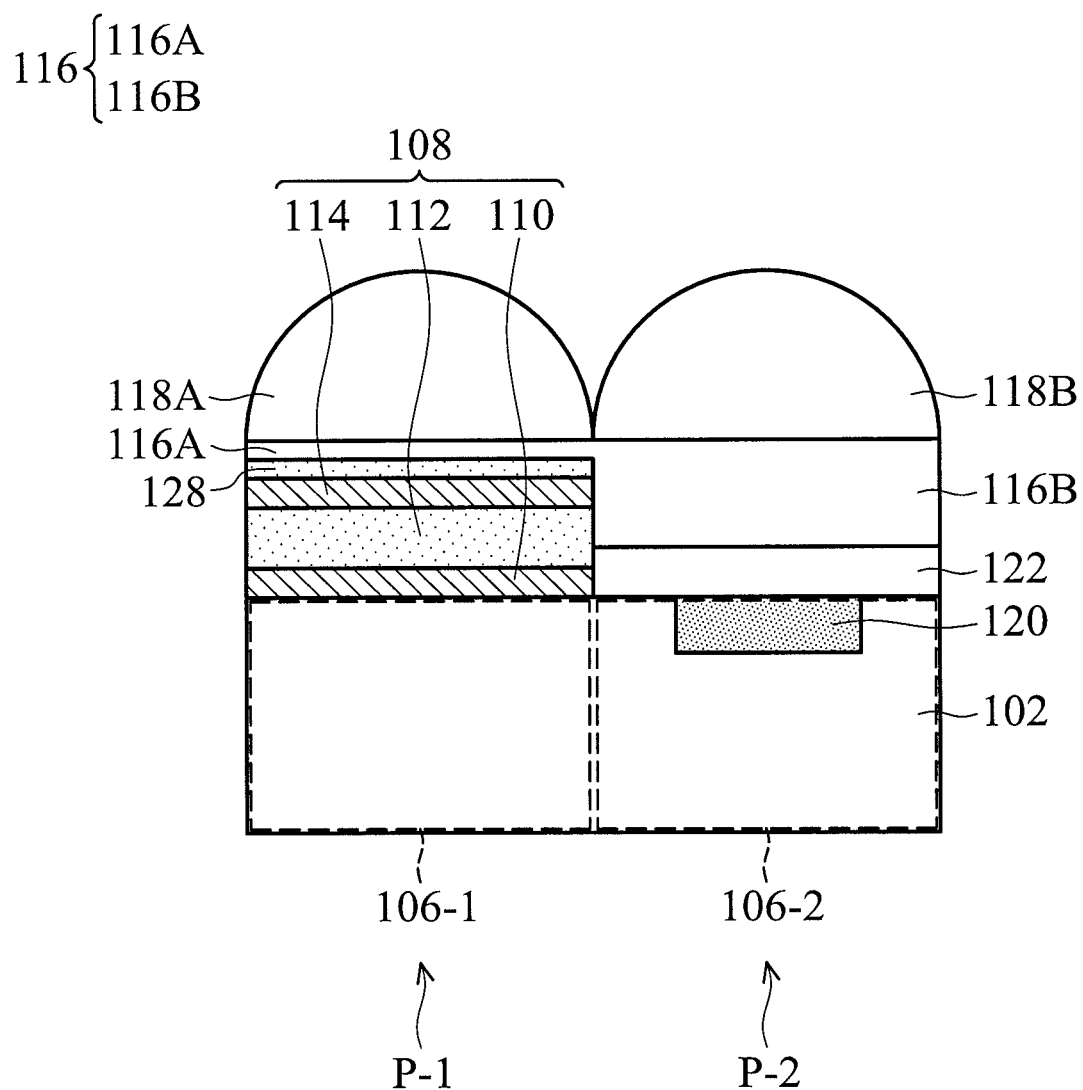
FIG. 7 is a cross-sectional view of an image sensor in accordance with some other embodiments of the present disclosure.

FIG. 7 is a cross-sectional view of an image sensor 700 in accordance with some other embodiments of the present disclosure. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

The difference between the embodiments shown in FIG. 7 and the embodiments shown in FIG. 1B is that the first pixel P-1 further includes a cover layer 128 disposed on the first photoelectric conversion component 108. In some embodiments of the present disclosure, as illustrated in FIG. 7, the cover layer 128 is disposed between the first photoelectric conversion component 108 and the first transparent layer 116A. In some embodiments of the present disclosure, the cover layer 128 may be used to suppress an undesired peak in the spectrum, such as a blue peak.

The material of the cover layer 128 includes a semiconductor material, a dielectric material, any other suitable material, or a combination thereof. The semiconductor material may include silicon or another elementary semiconductor material such as germanium. In some other embodiments, the semiconductor material includes a compound semiconductor. The compound semiconductor may include gallium arsenide, silicon carbide, indium arsenide, indium phosphide, another suitable material, or a combination thereof. In some embodiments of the present disclosure, the semiconductor material may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

The dielectric material includes silicon oxide, silicon nitride, silicon oxynitride, silicon carbide, any other suitable dielectric material, or a combination thereof. In some embodiments of the present disclosure, the dielectric material may be formed by chemical vapor deposition or spin-on coating. The chemical vapor deposition may include, but is not limited to, low-pressure chemical vapor deposition (LPCVD), low-temperature chemical vapor deposition (LTCVD), rapid thermal chemical vapor deposition (RT-CVD), plasma enhanced chemical vapor deposition (PECVD), atomic layer deposition (ALD), or any other suitable method.

Figure 8:
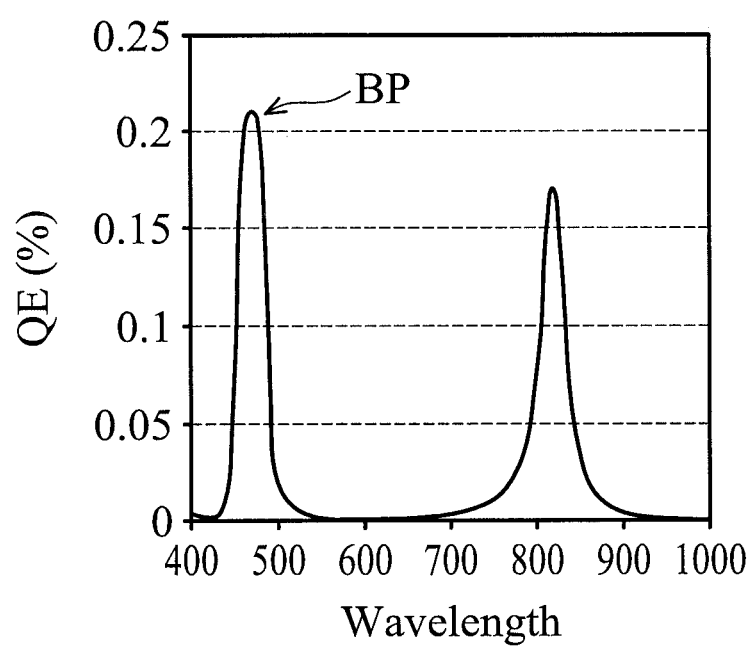
FIG. 8 is a spectrum of quantum efficiency versus wavelength.

FIG. 8 is a spectrum of quantum efficiency versus wavelength derived by a device without a cover layer. As illustrated in FIG. 8, in some cases, an undesired peak such as the blue peak BP shown in FIG. 8 is detected. In some embodiments of the present disclosure, the cover layer 128 may reduce or suppress the undesired peak in the spectrum. Therefore, signal quality may be improved by forming the cover layer 128.

Figure 9A:
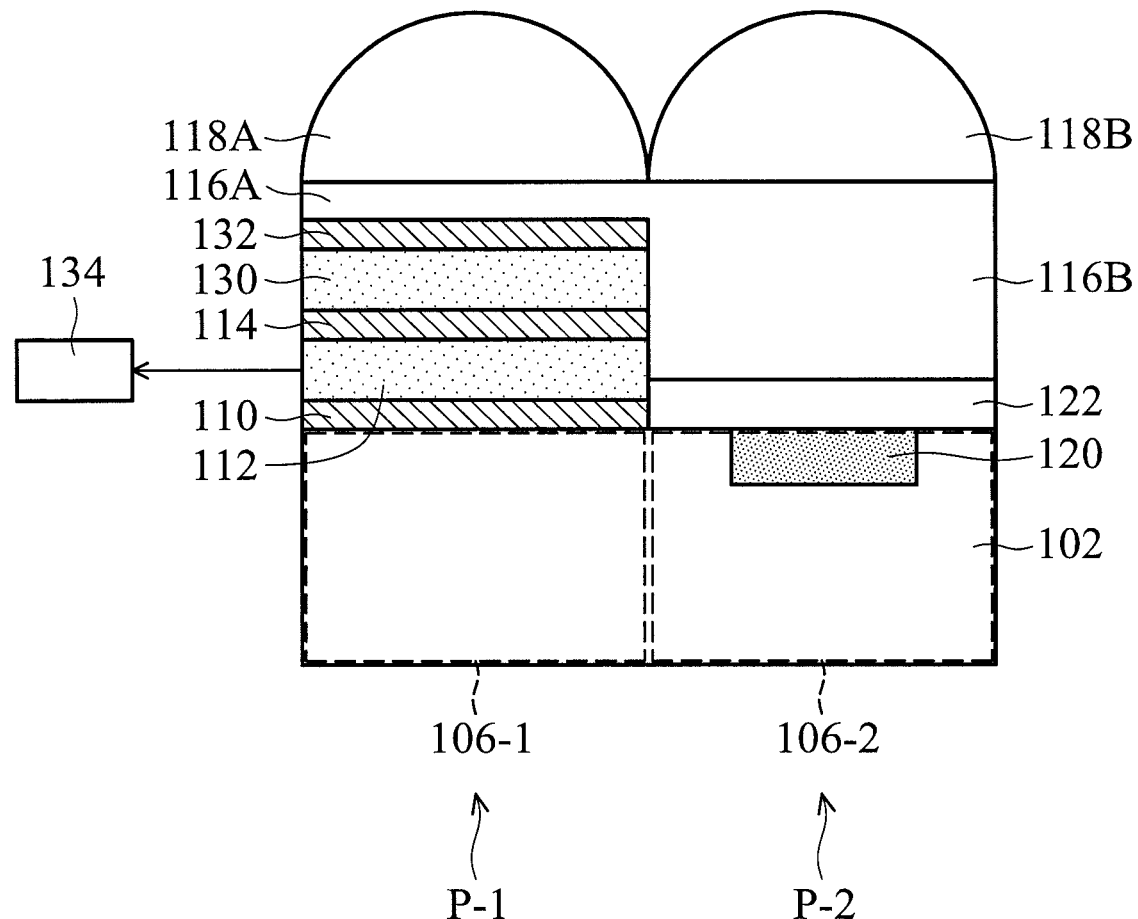
FIG. 9A is a cross-sectional view of an image sensor in accordance with some other embodiments of the present disclosure.

FIG. 9A is a cross-sectional view of an image sensor 900A in accordance with some other embodiments of the present disclosure. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

The difference between the embodiments shown in FIG. 9A and the embodiments shown in FIG. 1B is that the first photoelectric conversion component 108 further includes a first additional layer 130 disposed on the second metal layer 114, and a third metal layer 132 disposed on the first additional layer 130.

In some embodiments of the present disclosure, the material of the first additional layer 130 includes a doped semiconductor layer, a quantum film, an un-doped semiconductor layer, a dielectric layer, or another photoelectric conversion material. In some embodiments of the present disclosure, the material of the doped or un-doped semiconductor layer includes silicon or another elementary semiconductor material such as germanium. In some other embodiments, the doped or un-doped semiconductor layer includes a compound semiconductor. The compound semiconductor may include gallium arsenide, silicon carbide, indium arsenide, indium phosphide, another suitable material, or a combination thereof.

In some embodiments of the present disclosure, the doped or un-doped semiconductor layer may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HYPE), liquid phase epitaxy (LPE), chloride vapor phase epitaxy (Cl-VPE), or any other suitable method.

In some embodiments of the present disclosure, the quantum film includes an organic layer blended with quantum dots or an inorganic layer blended with quantum dots. In some embodiments of the present disclosure, the material of the quantum dots includes ZnS, ZnSe, ZnTe, CdS, CdSe, CdTe, HgS, HgSe, HgTe, BN, BP, BAs, BSb, AlN, AlP, AlAs, AlSb, GaN, GaP, GaAs, GaSb, inAs, inN, inP, inSb, any other suitable quantum dot material, or a combination thereof. In some embodiments of the present disclosure, the quantum film may be formed by spin-on coating or any other applicable method.

In some embodiments of the present disclosure, the dielectric layer includes silicon oxide, silicon nitride, silicon oxynitride, any other suitable dielectric layer, or a combination thereof. In some embodiments of the present disclosure, the dielectric layer may be formed by chemical vapor deposition or spin-on coating. The chemical vapor deposition may include, but is not limited to, low-pressure chemical vapor deposition, low-temperature chemical vapor deposition, rapid thermal chemical vapor deposition, plasma enhanced chemical vapor deposition, atomic layer deposition, or any other suitable method.

In some embodiments of the present disclosure, the first additional layer 130 may alternatively be called the first additional photoelectric conversion layer.

In some embodiments of the present disclosure, the material of the third metal layer 132 includes Ag, Au, Cu, W, Al, Mo, Ti, Pt, Ir, Ni, Cr, Rh, alloys thereof, any other suitable conductive material, or a combination thereof. In some embodiments, the third metal layer 132 is deposited by using chemical vapor deposition, sputtering, resistive thermal evaporation, electron beam evaporation, or another applicable method. In some embodiments of the present disclosure, the chemical vapor deposition may include, but is not limited to, low-pressure chemical vapor deposition, low-temperature chemical vapor deposition, rapid thermal chemical vapor deposition, plasma enhanced chemical vapor deposition, atomic layer deposition, or any other suitable method.

In some embodiments of the present disclosure, the second metal layer 114, the first additional layer 130 and the third metal layer 132 form another Fabry-Perot cavity in the first photoelectric conversion component 108. Therefore, signal quality may be improved further.

In some embodiments of the present disclosure, as illustrated in FIG. 9A, in the first photoelectric conversion component 108, only the first photoelectric conversion layer 112 is electrically connected to the pad 134 and is used to transmit the signal.

Figure 9B:
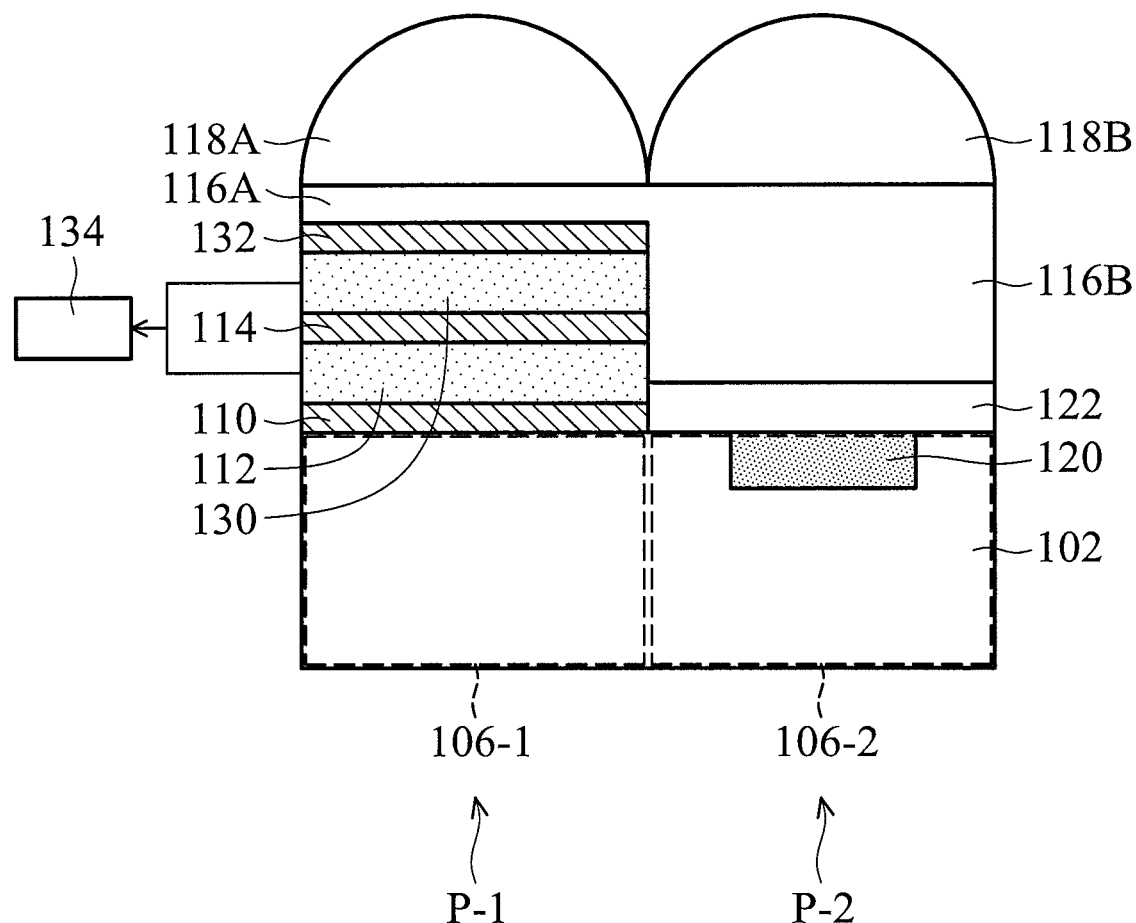
FIG. 9B is a cross-sectional view of an image sensor in accordance with some other embodiments of the present disclosure.

FIG. 9B is a cross-sectional view of an image sensor 900B in accordance with some other embodiments of the present disclosure. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

The difference between the embodiments shown in FIG. 9B and the embodiments shown in FIG. 9A is that in the first photoelectric conversion component 108, both the first photoelectric conversion layer 112 and the first additional layer 130 are electrically connected to the pad 134 and are used to transmit the signal.

Figure 10A:
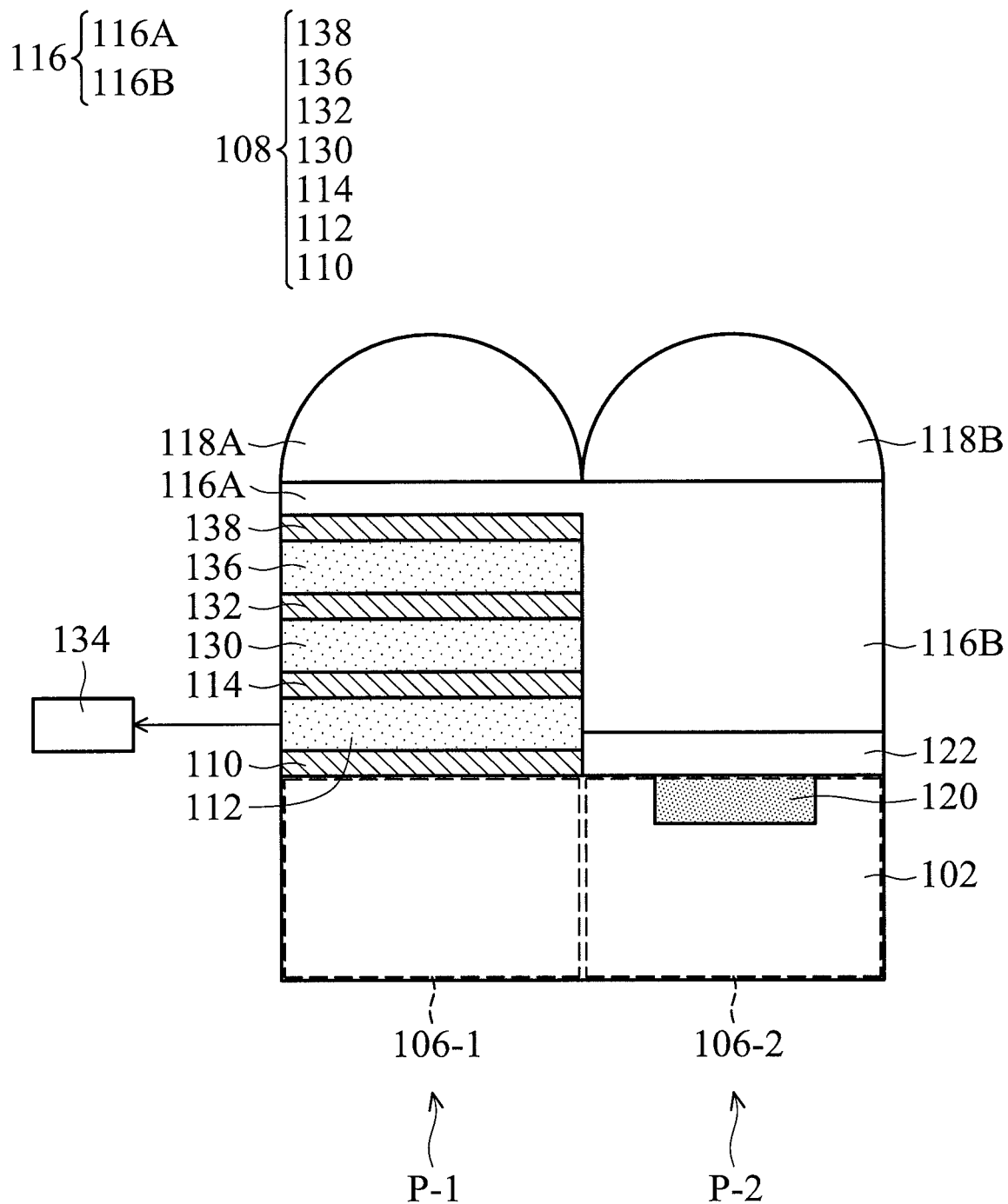
FIG. 10A is a cross-sectional view of an image sensor in accordance with some other embodiments of the present disclosure.

FIG. 10A is a cross-sectional view of an image sensor 1000A in accordance with some other embodiments of the present disclosure. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

The difference between the embodiments shown in FIG. 10A and the embodiments shown in FIGS. 9A and 9B is that the first photoelectric conversion component 108 further includes a second additional layer 136 disposed on the third metal layer 132, and a fourth metal layer 138 disposed on the second additional layer 136.

In some embodiments of the present disclosure, the material of the second additional layer 136 includes a doped semiconductor layer, a quantum film, an un-doped semiconductor layer, a dielectric layer, or another photoelectric conversion material. In some embodiments of the present disclosure, the material of the doped or un-doped semiconductor layer includes silicon or another elementary semiconductor material such as germanium. In some other embodiments, the doped or un-doped semiconductor layer includes a compound semiconductor. The compound semiconductor may include gallium arsenide, silicon carbide, indium arsenide, indium phosphide, another suitable material, or a combination thereof.

In some embodiments of the present disclosure, the doped or un-doped semiconductor layer may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

In some embodiments of the present disclosure, the quantum film includes an organic layer blended with quantum dots or an inorganic layer blended with quantum dots. In some embodiments of the present disclosure, the material of the quantum dots includes ZnS, ZnSe, ZnTe, CdS, CdSe, CdTe, HgS, HgSe, HgTe, BN, BP, BAs, BSb, AlN, AlP, AlAs, AlSb, GaN, GaP, GaAs, GaSb, inAs, inN, inP, inSb, any other suitable quantum dot material, or a combination thereof. In some embodiments of the present disclosure, the quantum film may be formed by spin-on coating or any other applicable method.

In some embodiments of the present disclosure, the dielectric layer includes silicon oxide, silicon nitride, silicon oxynitride, any other suitable dielectric layer, or a combination thereof. In some embodiments of the present disclosure, the dielectric layer may be formed by chemical vapor deposition or spin-on coating. The chemical vapor deposition may include, but is not limited to, low-pressure chemical vapor deposition, low-temperature chemical vapor deposition, rapid thermal chemical vapor deposition, plasma enhanced chemical vapor deposition, atomic layer deposition, or any other suitable method.

In some embodiments of the present disclosure, the second additional layer 136 may alternatively be called a second additional photoelectric conversion layer.

In some embodiments of the present disclosure, the material of the fourth metal layer 138 includes Ag, Au, Cu, W, Al, Mo, Ti, Pt, Ir, Ni, Cr, Rh, alloys thereof, any other suitable conductive material, or a combination thereof. In some embodiments, the fourth metal layer 138 is deposited by using chemical vapor deposition, sputtering, resistive thermal evaporation, electron beam evaporation, or another applicable method. In some embodiments of the present disclosure, the chemical vapor deposition may include, but is not limited to, low-pressure chemical vapor deposition, low-temperature chemical vapor deposition, rapid thermal chemical vapor deposition, plasma enhanced chemical vapor deposition, atomic layer deposition, or any other suitable method.

In some embodiments of the present disclosure, the third metal layer 132, the second additional layer 136 and the fourth metal layer 138 form another Fabry-Perot cavity in the first photoelectric conversion component 108. Therefore, signal quality may be improved further.

In some embodiments of the present disclosure, as illustrated in FIG. 10A, in the first photoelectric conversion component 108, only the first photoelectric conversion layer 112 is electrically connected to the pad 134 and is used to transmit the signal.

Figure 10B:
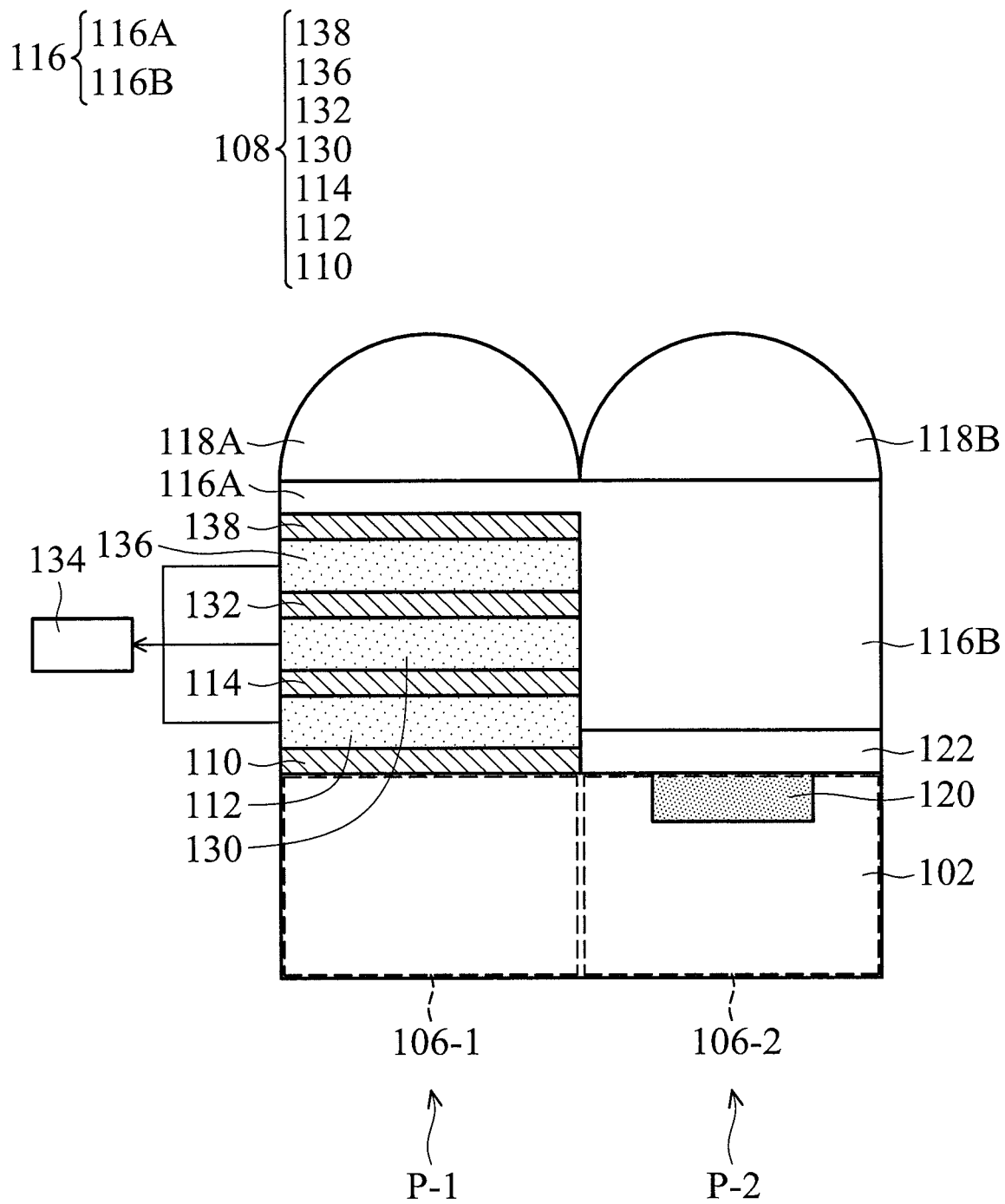
FIG. 10B is a cross-sectional view of an image sensor in accordance with some other embodiments of the present disclosure.

FIG. 10B is a cross-sectional view of an image sensor 1000B in accordance with some other embodiments of the present disclosure. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

The difference between the embodiments shown in FIG. 10B and the embodiments shown in FIG. 10A is that in the first photoelectric conversion component 108, all the first photoelectric conversion layer 112, the first additional layer 130, and the second additional layer 136 are electrically connected to the pad 134 and are used to transmit the signal.

Figure 11A:
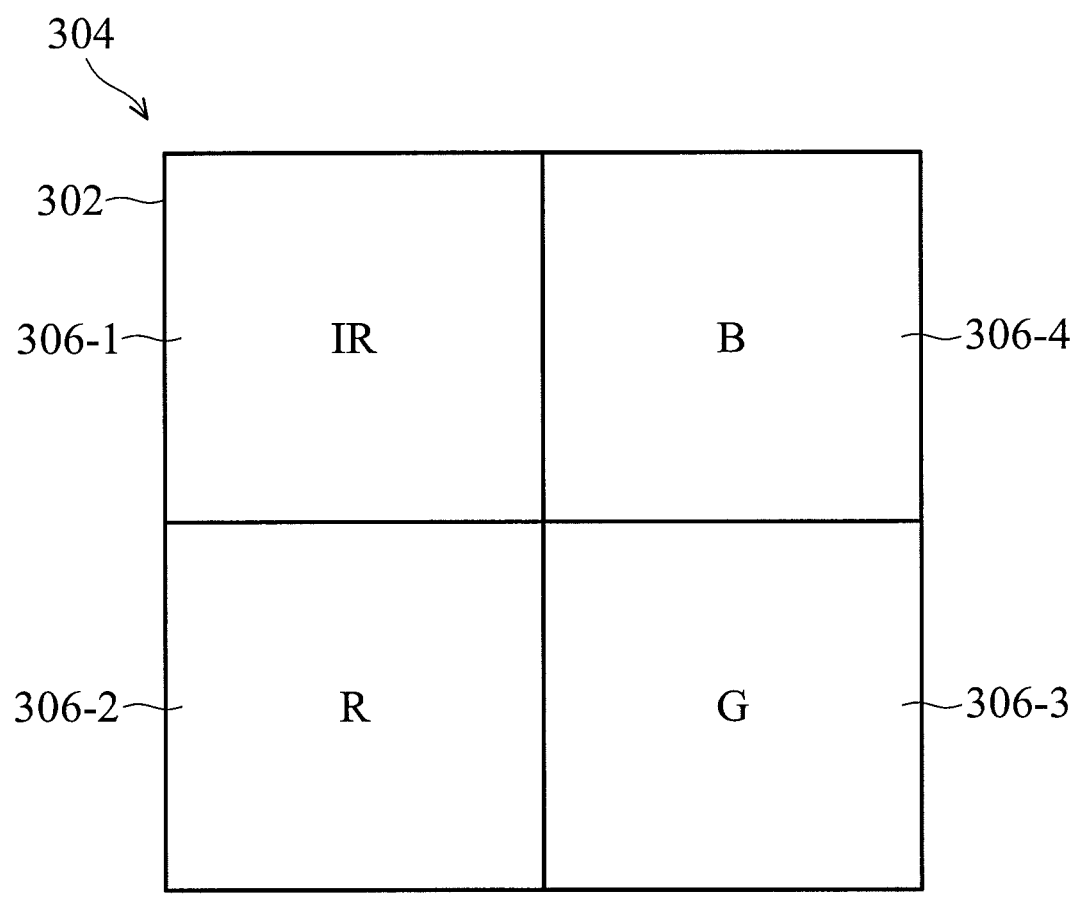
FIG. 11A is a top view of an image sensor in accordance with some other embodiments of the present disclosure.
Figure 11B:
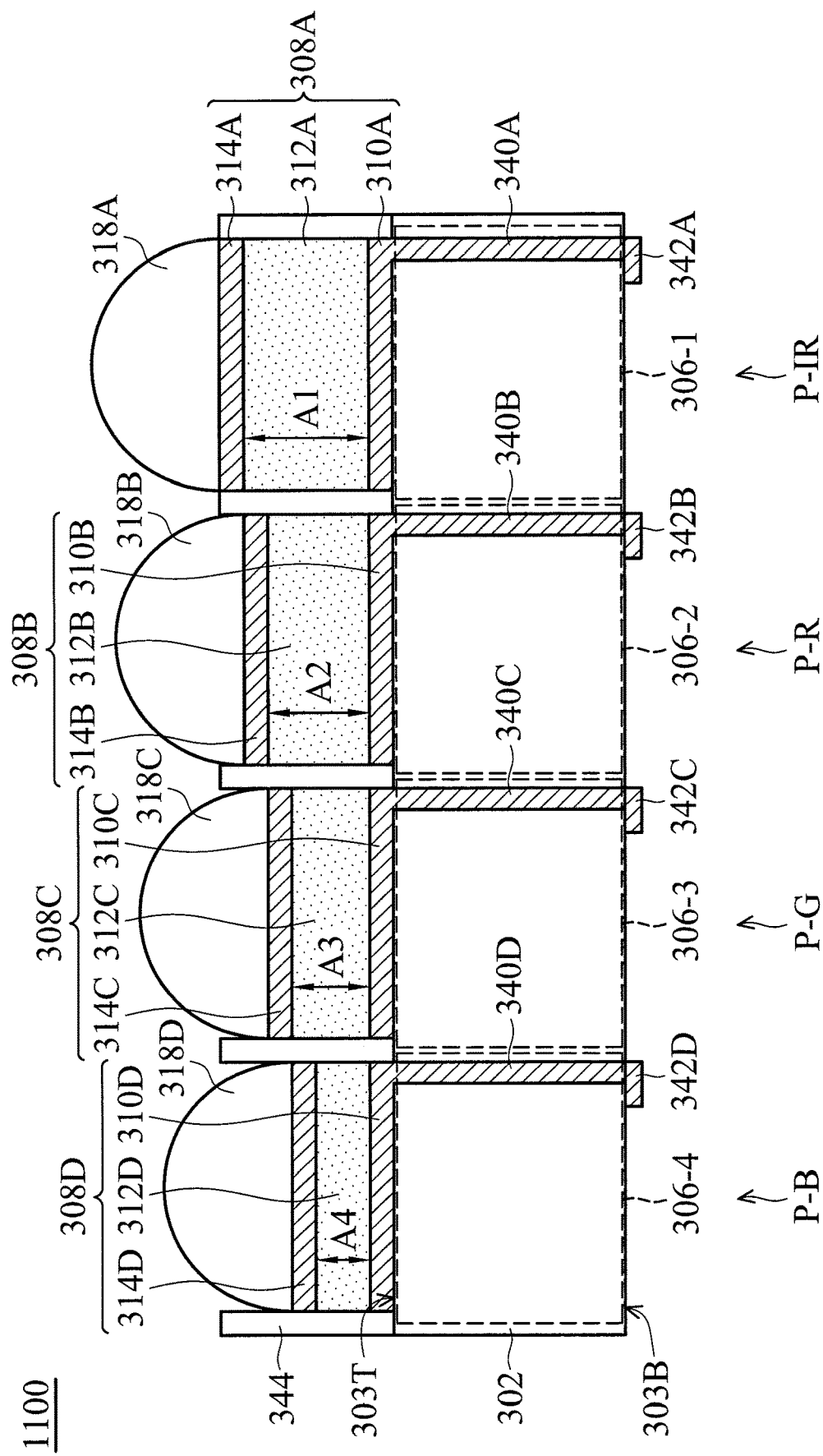
FIG. 11B is a cross-sectional view of an image sensor in accordance with some other embodiments of the present disclosure.

FIG. 11A is a top view of an image sensor 1100 in accordance with some other embodiments of the present disclosure. FIG. 11B is a cross-sectional view of an image sensor 1100 in accordance with some other embodiments of the present disclosure. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

Referring to FIGS. 11A-11B, the image sensor 1100 includes a substrate 302. As illustrated in FIG. 11A, the substrate 302 includes a pixel array 304, which includes an infrared (IR) pixel region 306-1, a red (R) pixel region 306-2, a green (G) pixel region 306-3, and a blue (B) pixel region 306-4. As shown in FIG. 11B, the blue (B) pixel region 306-4 is adjacent to the green (G) pixel region 306-3. The green (G) pixel region 306-3 is adjacent to the red (R) pixel region 306-2. The red (R) pixel region 306-2 is adjacent to the infrared (IR) pixel region 306-1.

FIG. 11B shows the infrared (IR) pixel region 306-1, the red (R) pixel region 306-2, the green (G) pixel region 306-3, and the blue (B) pixel region 306-4 of the substrate 302. In some embodiments of the present disclosure, the substrate 302 is a carrier substrate. In some embodiments of the present disclosure, the substrate 302 may include, but is not limited to, a glass substrate, a ceramic substrate, a plastic substrate, or any other suitable transparent substrate. In some embodiments of the present disclosure, the substrate 302 is an insulating substrate.

In some embodiments of the present disclosure, referring to FIG. 11B, the image sensor 1100 includes an IR pixel P-IR and a red pixel P-R. In addition, the image sensor 1100 further includes a green pixel P-G and a blue pixel P-B.

As illustrated in FIG. 11B, in some embodiments of the present disclosure, the IR pixel P-IR includes the infrared (IR) pixel region 306-1 of the substrate 302, and a first photoelectric conversion component 308A disposed on the top surface 303T of the substrate 302 and disposed on the Infrared (IR) pixel region 306-1.

As illustrated in FIG. 11B, in some embodiments of the present disclosure, the IR pixel P-IR further includes a first microlens 318A disposed on the first photoelectric conversion component 308A. However, embodiments of the present disclosure are not limited thereto. In some other embodiments, the IR pixel P-IR does not include a microlens.

As illustrated in FIG. 11B, in some embodiments of the present disclosure, the first photoelectric conversion component 308A includes a first bottom metal layer 310A disposed on the Infrared (IR) pixel region 306-1 of the substrate 302, a first photoelectric conversion layer 312A disposed on the first bottom metal layer 310A, and a first top metal layer 314A disposed on the first photoelectric conversion layer 312A. In some embodiments of the present disclosure, as illustrated in FIG. 11B, the first photoelectric conversion layer 312A has a first thickness A1.

In some embodiments of the present disclosure, the material and the formation method of the first bottom metal layer 310A are the same as or similar to that of the first metal layer 110 described above. In some embodiments of the present disclosure, the material and the formation method of the first photoelectric conversion layer 312A are the same as or similar to that of the first photoelectric conversion layer 112 described above. In some embodiments of the present disclosure, the material and the formation method of the first top metal layer 314A are the same as or similar to that of the second metal layer 114 described above.

In some embodiments of the present disclosure, as illustrated in FIG. 11B, the thickness of the first bottom metal layer 310A is substantially equal to the thickness of the first top metal layer 314A. However, embodiments of the present disclosure are not limited thereto. In some other embodiments, the thickness of the first bottom metal layer 310A is greater than the thickness of the first top metal layer 314A.

In some embodiments of the present disclosure, as illustrated in FIG. 11B, the first bottom metal layer 310A of the first photoelectric conversion component 308A is electrically connected to a conductive pad 342A through an electrical wire 340A. In some embodiments of the present disclosure, as illustrated in FIG. 11B, the conductive pad 342A is disposed on the bottom surface 303B of the substrate 302, and the electrical wire 340A is disposed in the substrate 302.

In some embodiments of the present disclosure, the material of the electrical wire 340A and the conductive pad 342A independently includes Ag, Au, Cu, W, Al, Mo, Ti, Pt, Ir, Ni, Cr, Rh, alloys thereof, any other suitable conductive material, or a combination thereof.

As illustrated in FIG. 11B, in some embodiments of the present disclosure, the red pixel P-R includes the red (R) pixel region 306-2 of the substrate 302, and a second photoelectric conversion component 308B disposed on the top surface 303T of the substrate 302 and disposed on the red (R) pixel region 306-2.

As illustrated in FIG. 11B, in some embodiments of the present disclosure, the red pixel P-R further includes a second microlens 318B disposed on the second photoelectric conversion component 308B. However, embodiments of the present disclosure are not limited thereto. In some other embodiments, the red pixel P-R does not include a microlens.

As illustrated in FIG. 11B, in some embodiments of the present disclosure, the second photoelectric conversion component 308B includes a second bottom metal layer 310B disposed on the red (R) pixel region 306-2 of the substrate 302, a second photoelectric conversion layer 312B disposed on the second bottom metal layer 310B, and a second top metal layer 314B disposed on the second photoelectric conversion layer 312B. In some embodiments of the present disclosure, as illustrated in FIG. 11B, the second photoelectric conversion layer 312B has a second thickness A2.

In some embodiments of the present disclosure, the material and the formation method of the second bottom metal layer 310B are the same as or similar to that of the first metal layer 110 described above. In some embodiments of the present disclosure, the material and the formation method of the second photoelectric conversion layer 312B are the same as or similar to that of the first photoelectric conversion layer 112 described above. In some embodiments of the present disclosure, the material and the formation method of the second top metal layer 314B are the same as or similar to that of the second metal layer 114 described above.

In some embodiments of the present disclosure, as illustrated in FIG. 11B, the thickness of the second bottom metal layer 310B is substantially equal to the thickness of the second top metal layer 314B. However, embodiments of the present disclosure are not limited thereto. In some other embodiments, the thickness of the second bottom metal layer 310B is greater than the thickness of the second top metal layer 314B.

In some embodiments of the present disclosure, as illustrated in FIG. 11B, the second bottom metal layer 310B of the second photoelectric conversion component 308B is electrically connected to a conductive pad 342B through an electrical wire 340B. In some embodiments of the present disclosure, as illustrated in FIG. 11B, the conductive pad 342B is disposed on the bottom surface 303B of the substrate 302, and the electrical wire 340B is disposed in the substrate 302.

In some embodiments of the present disclosure, the material of the electrical wire 340B and the conductive pad 342B independently includes Ag, Au, Cu, W, Al, Mo, Ti, Pt, Ir, Ni, Cr, Rh, alloys thereof, any other suitable conductive material, or a combination thereof.

In some embodiments of the present disclosure, the first thickness A1 of the first photoelectric conversion layer 312A is greater than the second thickness A2 of the second photoelectric conversion layer 312B.

In some embodiments of the present disclosure, since each of the first photoelectric conversion components 308A and 308B includes two metal layers and one photoelectric conversion layer disposed between the two metal layers, each of the first photoelectric conversion components 308A and 308B may function as a Fabry-Perot cavity. Therefore, the first photoelectric conversion components 308A and 308B may selectively detect light with a specific wavelength. In addition, the wavelength of the light to be detected may be changed by fine-tuning the thickness of the photoelectric conversion layer of the first photoelectric conversion components 308A and 308B. Therefore, in some embodiments of the present disclosure, by having the first thickness A1 be greater than the second thickness A2, the first photoelectric conversion component 308A of the IR pixel P-IR may selectively detect Infrared (IR) light, and the second photoelectric conversion component 308B of the red pixel P-R may selectively detect red light without using color filters. Thereby, the manufacturing cost may be reduced.

In some embodiments of the present disclosure, as illustrated in FIG. 11B, the top surface of the first top metal layer 314A of the first photoelectric conversion component 308A is higher than the top surface of the second top metal layer 314B of the second photoelectric conversion component 308B.

As illustrated in FIG. 11B, in some embodiments of the present disclosure, the green pixel P-G includes the green (G) pixel region 306-3 of the substrate 302, and a third photoelectric conversion component 308C disposed on the top surface 303T of the substrate 302 and disposed on the green (G) pixel region 306-3.

As illustrated in FIG. 11B, in some embodiments of the present disclosure, the green pixel P-G further includes a third microlens 318C disposed on the third photoelectric conversion component 308C. However, embodiments of the present disclosure are not limited thereto. In some other embodiments, the green pixel P-G does not include a microlens.

As illustrated in FIG. 11B, in some embodiments of the present disclosure, the third photoelectric conversion component 308C includes a third bottom metal layer 310C disposed on the green (G) pixel region 306-3 of the substrate 302, a third photoelectric conversion layer 312C disposed on the third bottom metal layer 310C, and a third top metal layer 314C disposed on the third photoelectric conversion layer 312C. In some embodiments of the present disclosure, as illustrated in FIG. 11B, the third photoelectric conversion layer 312C has a third thickness A3.

In some embodiments of the present disclosure, the material and the formation method of the third bottom metal layer 310C are the same as or similar to that of the first metal layer 110 described above. In some embodiments of the present disclosure, the material and the formation method of the third photoelectric conversion layer 312C are the same as or similar to that of the first photoelectric conversion layer 112 described above. In some embodiments of the present disclosure, the material and the formation method of the third top metal layer 314C are the same as or similar to that of the second metal layer 114 described above.

In some embodiments of the present disclosure, as illustrated in FIG. 11B, the thickness of the third bottom metal layer 310C is substantially equal to the thickness of the third top metal layer 314C. However, embodiments of the present disclosure are not limited thereto. In some other embodiments, the thickness of the third bottom metal layer 310C is greater than the thickness of the third top metal layer 314C.

In some embodiments of the present disclosure, as illustrated in FIG. 11B, the third bottom metal layer 310C of the third photoelectric conversion component 308C is electrically connected to a conductive pad 342C through an electrical wire 340C. In some embodiments of the present disclosure, as illustrated in FIG. 11B, the conductive pad 342C is disposed on the bottom surface 303B of the substrate 302, and the electrical wire 340C is disposed in the substrate 302.

In some embodiments of the present disclosure, the material of the electrical wire 340C and the conductive pad 342C independently includes Ag, Au, Cu, W, Al, Mo, Ti, Pt, Ir, Ni, Cr, Rh, alloys thereof, any other suitable conductive material, or a combination thereof.

In some embodiments of the present disclosure, the second thickness A2 of the second photoelectric conversion layer 312B is greater than the third thickness A3 of the third photoelectric conversion layer 312C.

In some embodiments of the present disclosure, since each of the first photoelectric conversion components 308B and 308C includes two metal layers and one photoelectric conversion layer disposed between the two metal layers, each of the first photoelectric conversion components 308B and 308C may function as a Fabry-Perot cavity. Therefore, the first photoelectric conversion components 308B and 308C may selectively detect light with a specific wavelength. In addition, the wavelength of the light to be detected may be changed by fine-tuning the thickness of the photoelectric conversion layer of the first photoelectric conversion components 308B and 308C. Therefore, in some embodiments of the present disclosure, by having the second thickness A2 be greater than the third thickness A3, the second photoelectric conversion component 308B of the red pixel P-R may selectively detect red light, and the third photoelectric conversion component 308C of the green pixel P-G may selectively detect green light without using color filters. Thereby, the manufacturing cost may be reduced.

In some embodiments of the present disclosure, as illustrated in FIG. 11B, the top surface of the second top metal layer 314B of the second photoelectric conversion component 308B is higher than the top surface of the third top metal layer 314C of the third photoelectric conversion component 308C.

As illustrated in FIG. 11B, in some embodiments of the present disclosure, the blue pixel P-B includes the blue (B) pixel region 306-4 of the portion of the substrate 302, and a fourth photoelectric conversion component 308D disposed on the top surface 303T of the substrate 302 and disposed on the blue (B) pixel region 306-4.

As illustrated in FIG. 11B, in some embodiments of the present disclosure, the blue pixel P-B further includes a fourth microlens 318D disposed on the fourth photoelectric conversion component 308D. However, embodiments of the present disclosure are not limited thereto. In some other embodiments, the blue pixel P-B does not include a microlens.

As illustrated in FIG. 11B, in some embodiments of the present disclosure, the fourth photoelectric conversion component 308D includes a fourth bottom metal layer 310D disposed on the blue (B) pixel region 306-4 of the substrate 302, a fourth photoelectric conversion layer 312D disposed on the fourth bottom metal layer 310D, and a fourth top metal layer 314D disposed on the fourth photoelectric conversion layer 312D. In some embodiments of the present disclosure, as illustrated in FIG. 11B, the fourth photoelectric conversion layer 312D has a fourth thickness A4.

In some embodiments of the present disclosure, the material and the formation method of the fourth bottom metal layer 310D are the same as or similar to that of the first metal layer 110 described above. In some embodiments of the present disclosure, the material and the formation method of the fourth photoelectric conversion layer 312D are the same as or similar to that of the first photoelectric conversion layer 112 described above. In some embodiments of the present disclosure, the material and the formation method of the fourth top metal layer 314D are the same as or similar to that of the second metal layer 114 described above.

In some embodiments of the present disclosure, as illustrated in FIG. 11B, the thickness of the fourth bottom metal layer 310D is substantially equal to the thickness of the fourth top metal layer 314D. However, embodiments of the present disclosure are not limited thereto. In some other embodiments, the thickness of the fourth bottom metal layer 310D is greater than the thickness of the fourth top metal layer 314D.

In some embodiments of the present disclosure, as illustrated in FIG. 11B, the fourth bottom metal layer 310D of the fourth photoelectric conversion component 308D is electrically connected to a conductive pad 342D through an electrical wire 340D. In some embodiments of the present disclosure, as illustrated in FIG. 11B, the conductive pad 342D is disposed on the bottom surface 303B of the substrate 302, and the electrical wire 340D is disposed in the substrate 302.

In some embodiments of the present disclosure, the material of the electrical wire 340D and the conductive pad 342D independently includes Ag, Au, Cu, W, Al, Mo, Ti, Pt, Ir, Ni, Cr, Rh, alloys thereof, any other suitable conductive material, or a combination thereof.

In some embodiments of the present disclosure, the third thickness A3 of the third photoelectric conversion layer 312C is greater than the fourth thickness A4 of the fourth photoelectric conversion layer 312D.

In some embodiments of the present disclosure, since each of the first photoelectric conversion components 308C and 308D includes two metal layers and one photoelectric conversion layer disposed between the two metal layers, each of the first photoelectric conversion components 308C and 308D may function as a Fabry-Perot cavity. Therefore, the first photoelectric conversion components 308C and 308D may selectively detect light with a specific wavelength. In addition, the wavelength of the light to be detected may be changed by fine-tuning the thickness of the photoelectric conversion layer of the first photoelectric conversion components 308C and 308D. Therefore, in some embodiments of the present disclosure, by having the third thickness A3 be greater than the fourth thickness A4, the third photoelectric conversion component 308C of the green pixel P-G may selectively detect green light, and the fourth photoelectric conversion component 308D of the blue pixel P-B may selectively detect blue light without using color filters.

In some embodiments of the present disclosure, as illustrated in FIG. 11B, the top surface of the third top metal layer 314C of the third photoelectric conversion component 308C is higher than the top surface of the fourth top metal layer 314D of the fourth photoelectric conversion component 308D.

In some embodiments of the present disclosure, as illustrated in FIG. 11B, the image sensor 1100 further includes a plurality of isolation elements 344 disposed adjacent to the sidewalls of the first photoelectric conversion component 308A, the second photoelectric conversion component 308B, the third photoelectric conversion component 308C, and the fourth photoelectric conversion component 308D.

In some embodiments of the present disclosure, as illustrated in FIG. 11B, one isolation element 344 among these isolation elements 344 is disposed between the first photoelectric conversion component 308A and the second photoelectric conversion component 308B. In addition, another isolation element 344 is disposed between the second photoelectric conversion component 308B and the third photoelectric conversion component 308C. In addition, the other isolation element 344 is disposed between the third photoelectric conversion component 308C and the fourth photoelectric conversion component 308D.

In some embodiments of the present disclosure, the material of the isolation elements 344 may include, but is not limited to, an insulating dielectric material, an insulating polymer material, a doped semiconductor material, any other suitable insulating material, or a combination thereof.

In some embodiments of the present disclosure, the insulating dielectric material includes silicon oxide, silicon nitride, silicon oxynitride, any other suitable dielectric material, or a combination thereof. In some embodiments of the present disclosure, the doped semiconductor material includes silicon and has a different conductive type than that of the first photoelectric conversion layer 312A, the second photoelectric conversion layer 312B, the third photoelectric conversion layer 312C, and/or the fourth photoelectric conversion layer 312D.

Figure 12:
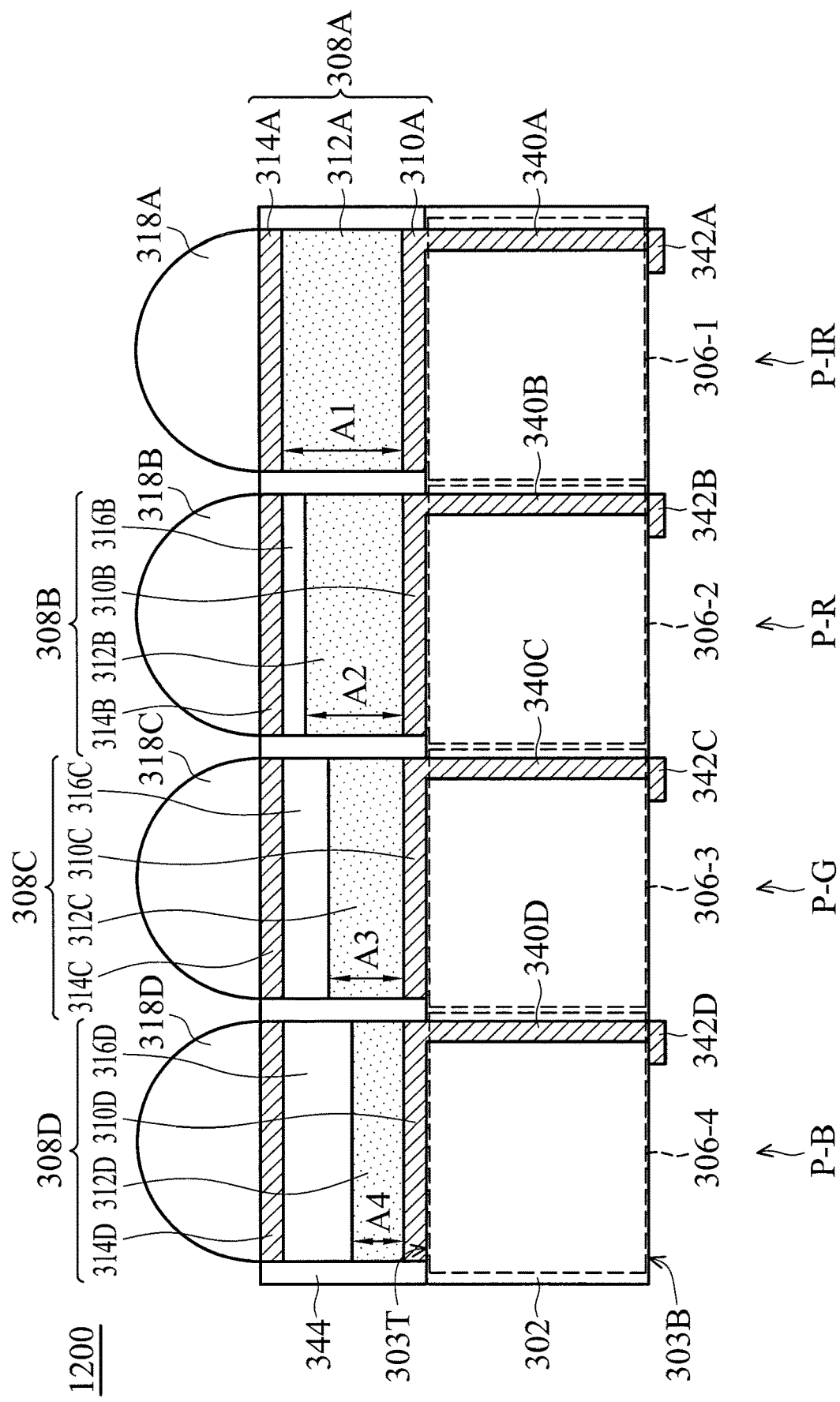
FIG. 12 is a cross-sectional view of an image sensor in accordance with some other embodiments of the present disclosure.

FIG. 12 is a cross-sectional view of an image sensor 1200 in accordance with some other embodiments of the present disclosure. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

The difference between the embodiments shown in FIG. 12 and the embodiments shown in FIG. 11B is that the second photoelectric conversion component 308B further includes a transparent layer 316B disposed between the second photoelectric conversion layer 312B and the second top metal layer 314B. In some embodiments of the present disclosure, the material of the first transparent layer 316B may include, but is not limited to, an organic transparent material, a dielectric material, a semiconductor material such as silicon, any other suitable transparent material, or a combination thereof. In some embodiments of the present disclosure, the dielectric material includes silicon oxide, silicon nitride, silicon oxynitride, any other suitable dielectric material, or a combination thereof.

In addition, in some embodiments of the present disclosure, the third photoelectric conversion component 308C further includes a transparent layer 316C disposed between the third photoelectric conversion layer 312C and the third top metal layer 314C. In some embodiments of the present disclosure, the material of the first transparent layer 316C may include, but is not limited to, an organic transparent material, a dielectric material, a semiconductor material such as silicon, any other suitable transparent material, or a combination thereof. In some embodiments of the present disclosure, the dielectric material includes silicon oxide, silicon nitride, silicon oxynitride, any other suitable dielectric material, or a combination thereof.

In addition, in some embodiments of the present disclosure, the fourth photoelectric conversion component 308D further includes a transparent layer 316D disposed between the fourth photoelectric conversion layer 312D and the fourth top metal layer 314D. In some embodiments of the present disclosure, the material of the first transparent layer 316D may include, but is not limited to, an organic transparent material, a dielectric material, a semiconductor material such as silicon, any other suitable transparent material, or a combination thereof. In some embodiments of the present disclosure, the dielectric material includes silicon oxide, silicon nitride, silicon oxynitride, any other suitable dielectric material, or a combination thereof.

In some embodiments of the present disclosure, as illustrated in FIG. 12, the top surface of the first top metal layer 314A of the first photoelectric conversion component 308A is substantially coplanar with the top surface of the second top metal layer 314B of the second photoelectric conversion component 308B, the top surface of the third top metal layer 314C of third photoelectric conversion stack 308C, and the top surface of the fourth top metal layer 314D of third photoelectric conversion stack 308D.

In summary, some embodiments of the present disclosure utilize a first photoelectric conversion component which may serve as a color filter and a photodiode simultaneously.

Therefore, the color filter and the photodiode do not need to be formed in the image sensor separately. Therefore, the number of elements formed in the image sensor may be reduced, and the cost may be reduced accordingly. In addition, due to the use of a first photoelectric conversion component, some embodiments of the present disclosure may reduce or prevent cross-talk between pixels. Therefore, signal quality may be improved. In some embodiments of the present disclosure, the oblique source performance of the image sensor may also be improved.

Note that the above element sizes, element parameters, and element shapes are not limitations of the present disclosure. Those skilled in the art can adjust these settings or values to meet different requirements. It should be understood that the image sensor and method for manufacturing the same of the present disclosure are not limited to the configurations of FIGS. 1A to 12. The present disclosure may merely include any one or more features of any one or more embodiments of FIGS. 1A to 12. In other words, not all of the features shown in the figures should be implemented in the image sensor and method for manufacturing the same of the present disclosure.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and operations described in the specification. As one of ordinary skill in the art will readily appreciate from the disclosure of the present disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. An image sensor, comprising:
   a substrate having a first region and a second region adjacent to each other; and
   a first photoelectric conversion component disposed on the first region of the substrate, the first photoelectric conversion component being a photodiode and an infrared (IR) light detector, wherein the first photoelectric conversion component comprises:
   a first metal layer formed on the substrate;
   a first photoelectric conversion layer formed directly on the first metal layer;
   a second metal layer formed directly on the first photoelectric conversion layer, wherein the first metal layer, the first photoelectric conversion layer and the second metal layer form a Fabry-Perot cavity that functions as the IR light detector by selectively detecting IR light by optical interference based on a wavelength of the IR light;
   a first additional photoelectric conversion layer disposed directly on the second metal layer; and
   a third metal layer disposed directly on the first additional photoelectric conversion layer, wherein the second metal layer, the first additional photoelectric conversion layer and the third metal layer form a first additional Fabry-Perot cavity;
   a second photoelectric conversion component disposed in the second region of the substrate, wherein the second photoelectric conversion component is embedded in the substrate;
   a high-k dielectric layer disposed only in the second region of the substrate;
   a transparent layer disposed directly on the high-k dielectric layer and extending over the first photoelectric conversion component; and
   a pad connected to the first photoelectric conversion layer, wherein an IR light detection signal is transmitted by the first photoelectric conversion component to the pad.

2. The image sensor as claimed in claim 1, wherein the first photoelectric conversion layer comprises a quantum film including an organic layer blended with quantum dots or an inorganic layer blended with quantum dots, a material of the quantum dots being ZnS, ZnSe, ZnTe, CdS, CdSe, CdTe, HgS, HgSe, HgTe, BN, BP, BAs, BSb, AlN, AlP, AlAs, AlSb, GaN, GaP, GaAs, GaSb, inAs, inN, inP, inSb, or a combination thereof.

3. The image sensor as claimed in claim 1, wherein the first metal layer and the second metal layer independently comprises Ag, Au, Cu, W, Al, Mo, Ti, Pt, Ir, Ni, Cr, Rh, alloys thereof, or a combination thereof.

4. The image sensor as claimed in claim 1, wherein the first metal layer is thicker than the second metal layer.

5. The image sensor as claimed in claim 1, wherein the first metal layer and the second metal layer have substantially the same thickness.

6. The image sensor as claimed in claim 1, wherein the second photoelectric conversion component is spaced apart from the first metal layer of the first photoelectric conversion component.

7. The image sensor as claimed in claim 1, further comprising:
   a microlens disposed on the first photoelectric conversion component.

8. The image sensor as claimed in claim 1, wherein the first photoelectric conversion component further comprises:
   a second additional photoelectric conversion layer disposed on the third metal layer; and
   a fourth metal layer disposed on the second additional photoelectric conversion layer, wherein the third metal layer, the second additional photoelectric conversion layer and the fourth metal layer form a second additional Fabry-Perot cavity.

9. The image sensor as claimed in claim 8, wherein the pad is further connected to the second additional photoelectric conversion layer.

10. The image sensor as claimed in claim 1, wherein the pad is further connected to the first additional photoelectric conversion layer.

11. The image sensor according to claim 1, wherein a thickness of the transparent layer disposed on the high-k dielectric layer is greater than a thickness of the transparent layer extending over the first photoelectric conversion component.

* * * * *